United States Patent
Ogawa et al.

(10) Patent No.: US 9,745,656 B2
(45) Date of Patent: Aug. 29, 2017

(54) METHOD OF MANUFACTURING SEMICONDUCTOR DEVICE, METHOD OF PROCESSING SUBSTRATE, SUBSTRATE PROCESSING APPARATUS AND COMPUTER-READABLE RECORDING MEDIUM

(71) Applicant: HITACHI KOKUSAI ELECTRIC INC., Tokyo (JP)

(72) Inventors: Arito Ogawa, Toyama (JP); Tsuyoshi Takeda, Toyama (JP)

(73) Assignee: HITACHI KOKUSAI ELECTRIC INC., Toyama-Shi (JP)

( * ) Notice: Subject to any disclaimer, the term of this patent is extended or adjusted under 35 U.S.C. 154(b) by 0 days.

(21) Appl. No.: 15/191,055

(22) Filed: Jun. 23, 2016

(65) Prior Publication Data

US 2016/0305017 A1 Oct. 20, 2016

Related U.S. Application Data

(63) Continuation of application No. 14/668,725, filed on Mar. 25, 2015, now Pat. No. 9,406,520, and a
(Continued)

(30) Foreign Application Priority Data

Sep. 14, 2011 (JP) .................................. 2011-200292
Jun. 21, 2012 (JP) .................................. 2012-139741

(51) Int. Cl.
*H01L 21/44* (2006.01)
*C23C 16/36* (2006.01)
(Continued)

(52) U.S. Cl.
CPC .............. *C23C 16/36* (2013.01); *C23C 14/14* (2013.01); *C23C 16/22* (2013.01);
(Continued)

(58) Field of Classification Search
CPC ... C23C 16/36; C23C 16/45531; C23C 16/30; H01L 21/02167; H01L 21/02126;
(Continued)

(56) References Cited

U.S. PATENT DOCUMENTS 4,269,899 A 5/1981 Fuyama et al.
6,146,697 A 11/2000 Undercoffer
(Continued)

FOREIGN PATENT DOCUMENTS

JP 2003-512527 A 4/2003
JP 2005-503484 A 2/2005
(Continued)

*Primary Examiner* — Charles Garber
*Assistant Examiner* — Abdulfattah Mustapha
(74) *Attorney, Agent, or Firm* — Volpe and Koenig, P.C.

(57) ABSTRACT

A method of manufacturing a semiconductor device, includes: alternately performing (i) a first step of alternately supplying a first raw material containing a first metal element and a halogen element and a second raw material containing a second metal element and carbon to a substrate by a first predetermined number of times, and (ii) a second step of supplying a nitridation raw material to the substrate, by a second predetermined number of times, wherein alternating the first and second steps forms a metal carbonitride film containing the first metal element having a predetermined thickness on the substrate.

21 Claims, 16 Drawing Sheets

Related U.S. Application Data continuation of application No. 14/190,574, filed on Feb. 26, 2014, now Pat. No. 9,012,323, and a continuation of application No. 13/616,148, filed on Sep. 14, 2012, now Pat. No. 8,951,912.

(51) Int. Cl.
| | |
|---|---|
| *C23C 14/14* | (2006.01) |
| *C23C 16/455* | (2006.01) |
| *H01L 21/02* | (2006.01) |
| *C23C 16/22* | (2006.01) |
| *H01L 21/285* | (2006.01) |
| *H01L 21/768* | (2006.01) |
| *C23C 16/46* | (2006.01) |
| *C23C 16/52* | (2006.01) |
| *H01L 21/28* | (2006.01) |

(52) U.S. Cl.
CPC .. *C23C 16/45531* (2013.01); *C23C 16/45546* (2013.01); *C23C 16/45557* (2013.01); *C23C 16/46* (2013.01); *C23C 16/52* (2013.01); *H01L 21/0262* (2013.01); *H01L 21/02521* (2013.01); *H01L 21/28556* (2013.01); *H01L 21/28568* (2013.01); *H01L 21/76877* (2013.01); *H01L 21/28088* (2013.01)

(58) Field of Classification Search
CPC ........... H01L 21/0228; H01L 21/02211; H01L 21/02172; H01L 21/02
USPC ......... 438/584, 658–758; 257/437, 626, 632, 257/634, 646, E21.159, E23.025, 257/E23.077, E23.116, E23.126, E33.06, 257/E31.119; 427/255.391, 255.39, 427/255.394, 249.17, 249.19

See application file for complete search history.

(56) References Cited

U.S. PATENT DOCUMENTS

| | | | |
|---|---|---|---|
| 6,475,276 | B1 | 11/2002 | Elers et al. |
| 7,410,666 | B2 | 8/2008 | Elers et al. |
| 7,611,751 | B2 | 11/2009 | Elers |
| 8,153,831 | B2 | 4/2012 | Thompson et al. |
| 2007/0090093 | A1 | 4/2007 | Kitamura et al. |
| 2007/0148350 | A1 | 6/2007 | Rahtu et al. |
| 2008/0233762 | A1 | 9/2008 | Hong |
| 2009/0074963 | A1 | 3/2009 | Iwai et al. |
| 2010/0025780 | A1 | 2/2010 | Kaneko et al. |
| 2010/0130024 | A1* | 5/2010 | Takasawa ......... C23C 16/45531 438/761 |

FOREIGN PATENT DOCUMENTS

| | | |
|---|---|---|
| JP | 2010-034440 A | 2/2010 |
| JP | 2010-504999 | 2/2010 |
| JP | 2010-0508661 | 3/2010 |
| JP | 2010-153795 A | 7/2010 |
| WO | 01-29280 A | 4/2001 |
| WO | 03-025243 A | 3/2003 |
| WO | 2008-039916 | 4/2008 |
| WO | 2008-057749 | 5/2008 |

\* cited by examiner

Ti2p spectrum

N1s spectrum

C1s spectrum

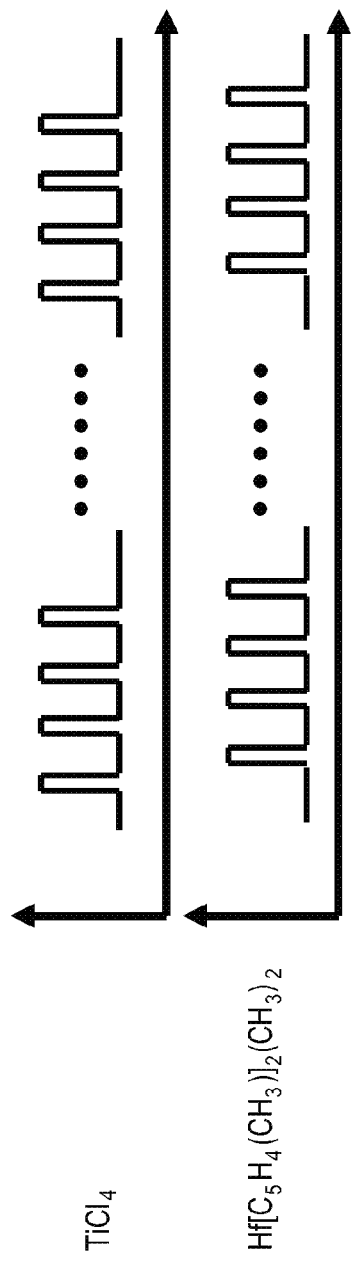

Ti2p spectrum

C1s spectrum

METHOD OF MANUFACTURING SEMICONDUCTOR DEVICE, METHOD OF PROCESSING SUBSTRATE, SUBSTRATE PROCESSING APPARATUS AND COMPUTER-READABLE RECORDING MEDIUM

CROSS-REFERENCE TO RELATED APPLICATIONS

This application is a continuation of U.S. patent application Ser. No. 14/668,725, filed on Mar. 25, 2015, which is a continuation of U.S. patent application Ser. No. 14/190,574, filed on Feb. 26, 2014, which is a continuation of U.S. patent application Ser. No. 13/616,148, filed on Sep. 14, 2012, which issued as U.S. Pat. No. 8,951,912 on Feb. 10, 2015, which is based upon and claims the benefit of priority from Japanese Patent Application No. 2011-200292, filed on Sep. 14, 2011, and Japanese Patent Application No. 2012-139741, filed on Jun. 21, 2012, the entire contents of which are incorporated herein by reference

TECHNICAL FIELD

The present disclosure relates to a semiconductor device manufacturing method including a process of forming a thin film on a substrate, a substrate processing method, a substrate processing apparatus and a computer-readable recording medium for storing instructions thereof.

BACKGROUND

With high integration and high performance of semiconductor devices such as MOSFETs (Metal-Oxide-Semiconductor Field Effect Transistors) and the like, various kinds of metal films are being used for electrodes, wirings and so on. For example, a metal carbide film such as a tantalum carbide (TaC) film, a titanium carbide (TiC) film or the like may be used for a gate electrode of a MOSFET from the standpoint of oxidation resistance, electric resistivity, work function and so on.

In consideration of film formation of a three-dimensional structure requiring step coverage, the above-mentioned metal carbide film may be formed using a CVD (Chemical Vapor Deposition) method rather than a deposition method such as sputtering. However, it has been difficult in the past to form a metal carbide film using the CVD method. Indeed, although many examples of forming metal nitride films using the CVD method has been reported, examples of forming metal carbide films have not been reported.

SUMMARY

The present disclosure provides some embodiments of a semiconductor device manufacturing method, a substrate processing method, a substrate processing apparatus and a computer-readable recording medium storing the instructions for executing such processes, which are capable of forming a metal carbide film that achieves good step coverage.

According to some embodiments, there is provided a method of manufacturing a semiconductor device, including: alternately performing (i) a first step of alternately supplying a first raw material containing a first metal element and a halogen element and a second raw material containing a second metal element and carbon to a substrate by a first predetermined number of times, and (ii) a second step of supplying a nitridation raw material to the substrate by a second predetermined number of times, wherein alternating the first and second steps forms a metal carbonitride film containing the first metal element having a predetermined thickness on the substrate.

According to some other embodiments, there is provided is a method of processing a substrate, including: alternately performing (i) a first step of alternately supplying a first raw material containing a first metal element and a halogen element and a second raw material containing a second metal element and carbon to a substrate by a first predetermined number of times, and (ii) a second step of supplying a nitridation raw material to the substrate by a second predetermined number of times, wherein alternating the first and second steps forms a metal carbonitride film containing the first metal element having a predetermined thickness on the substrate.

According to some other embodiments, there is provided an apparatus for processing a substrate, including: a process chamber configured to accommodate a substrate; a first raw material supply system configured to supply a first raw material containing a first metal element and a halogen element to the substrate in the process chamber; a second raw material supply system configured to supply a second raw material containing a second metal element and carbon to the substrate in the process chamber; a nitridation raw material supply system configured to supply a nitridation raw material to the substrate in the process chamber; and a control unit configured to control the first raw material supply system, the second raw material supply system and the nitridation raw material supply system so as to alternately perform (i) a first step of alternately supplying the first raw material and the second raw material to the substrate in the process chamber by a first predetermined number of times, and (ii) a second step of supplying the nitridation raw material to the substrate in the process chamber by a second predetermined number of times, wherein alternating the first and second steps forms a metal carbonitride film containing the first metal element having a predetermined thickness on the substrate.

According to yet other embodiments, there is provided a computer-readable recording medium for storing a program that causes a computer to perform a process including: alternately performing (i) a first step of alternately supplying a first raw material containing a first metal element and a halogen element and a second raw material containing a second metal element and carbon to a substrate in a process chamber of a substrate processing apparatus by a first predetermined number of times, and (ii) a second step of supplying a nitridation raw material to the substrate in the process chamber, by the second predetermined number of times, wherein alternating the first and second steps forms a metal carbonitride film containing the first metal element having a predetermined thickness on the substrate.

BRIEF DESCRIPTION OF THE DRAWINGS

FIG. 12 is a view illustrating timings of gas supply in a second example, according to some embodiments.

DETAILED DESCRIPTION

Various embodiments will be now described with reference to the drawings.

(1) Configuration of Substrate Processing Apparatus

Figure 1:
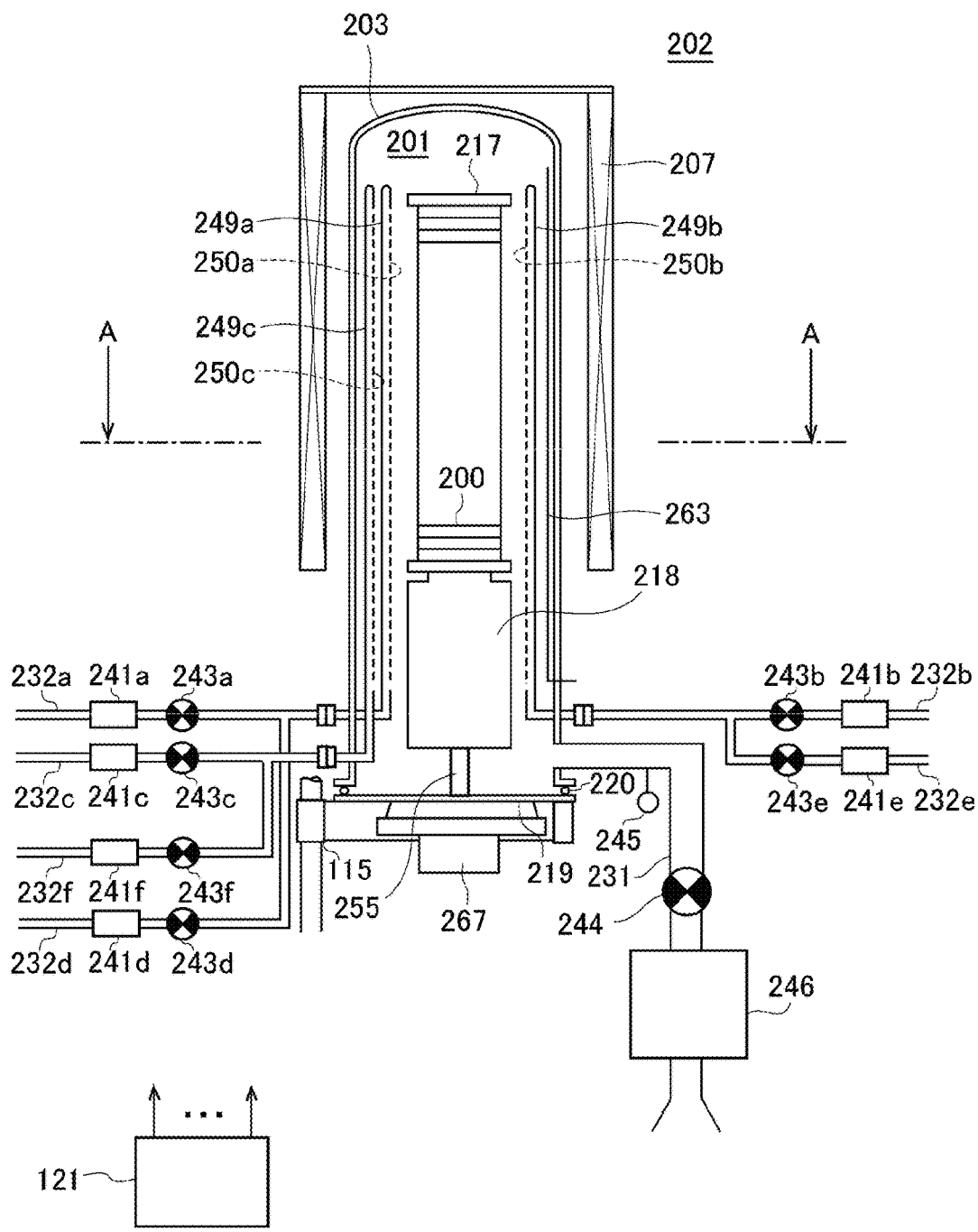
FIG. 1 is a schematic view illustrating a configuration of a vertical treatment furnace of a substrate processing apparatus, in which a portion of the treatment furnace is shown by a longitudinal sectional view, according to some embodiments.
Figure 2:
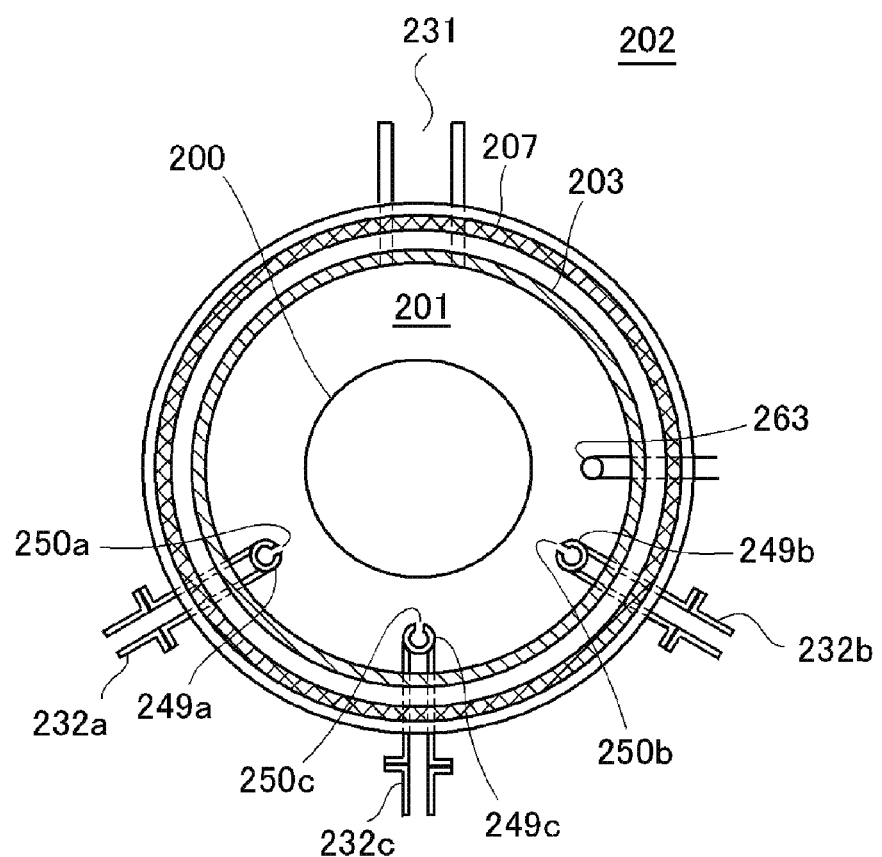
FIG. 2 is a schematic view illustrating a configuration of the vertical treatment furnace of the substrate processing apparatus, in which a portion of the treatment furnace is shown by a sectional view taken along line A-A in FIG. 1.

FIG. 1 is a schematic view illustrating a configuration of a vertical treatment furnace 202 of a substrate processing apparatus, according to some embodiments, in which a portion of the treatment furnace is shown by a longitudinal sectional view. FIG. 2 is a schematic view illustrating a configuration of the vertical treatment furnace 202 of the substrate processing apparatus, according to some embodiments, in which a portion of the treatment furnace is shown by a sectional view taken along line A-A in FIG. 1. The present disclosure is not limited to the substrate processing apparatus according to these embodiments, but may be applied to other substrate processing apparatus having a treatment furnace of single wafer type, hot wall type, cold wall type, or the like.

As shown in FIG. 1, the vertical treatment furnace 202 has a heater 207 as a heating means (heating mechanism). The heater 207 has a cylindrical shape and is supported by a heater base (not shown) as a support plate so as to be vertically arranged. The heater 207 acts as an activation mechanism to activate gas with heat, as will be described later.

A reaction tube 203 forming a reaction vessel (process vessel) is disposed inside the heater 207 in a concentric form along the heater 207. The reaction tube 203 is made of a heat resistant material such as, for example, quartz ($SiO_2$), silicon carbide (SiC) or the like and has a cylindrical shape with its upper end closed and its lower end opened. A process chamber 201 is formed in a hollow of the reaction tube 203 and is configured to accommodate wafers 200. The wafers 200 are horizontally stacked in multiple stages to be aligned in a vertical direction in a boat 217 which will be described later.

A first nozzle 249a as a first gas introduction part, a second nozzle 249b as a second gas introduction part, and a third nozzle 249c as a third gas introduction part are disposed to penetrate through a lower side wall of the reaction tube 203. The first nozzle 249a, the second nozzle 249b and the third nozzle 249c are respectively connected to a first gas supply pipe 232a, a second gas supply pipe 232b and a third gas supply pipe 232c. In this way, the three nozzles 249a, 249b and 249c and the three gas supply pipes 232a, 232b and 232c are provided in the reaction tube 203 to allow several kinds of (3 in this example) gases to be supplied into the process chamber 201.

An exhaustion pipe 231 is disposed at a lower portion of the reaction tube 203. In addition, a metal manifold (not shown) to support the reaction tube 203 may be disposed below the reaction tube 203 and the nozzles 249a, 249b and 249c may be disposed to penetrate through a side wall of the metal manifold. In this case, the exhaustion pipe 231 may be disposed at the metal manifold, rather than the lower portion of the reaction tube 203.

A mass flow controller (MFC) 241a as a flow rate controller (a flow rate control unit) and an opening/closing valve 243a are disposed in the first gas supply pipe 232a in this order from the upstream direction. In addition, a first inert gas supply pipe 232d is connected to the downstream side of the valve 243a of the first gas supply pipe 232a. A mass flow controller (MFC) 241d as a flow rate controller (a flow rate control unit) and an opening/closing valve 243d are disposed in the first inert gas supply pipe 232d in this order from the upstream direction. In addition, the above-mentioned first nozzle 249a is connected to a leading end of the first gas supply pipe 232a. The first nozzle 249a is vertically disposed along the inner wall of the reaction tube 203 in a circular arc-shaped space between the inner wall of the reaction tube 203 and the wafers 200. The first nozzle 249a is disposed in the flank of a wafer arrangement region where the wafers 200 are arranged and horizontally surrounds the wafer arrangement region. The first nozzle 249a is configured as an L-like long nozzle and has its horizontal portion disposed to penetrate through the lower side wall of the reaction tube 203 and its vertical portion disposed to rise from at least one end of the wafer arrangement region toward the other end thereof. A plurality of gas supply holes 250a through which gas is supplied is disposed at a side surface of the first nozzle 249a. The gas supply holes 250a are opened toward the center of the reaction tube 203 to supply gas toward the wafers 200. The gas supply holes 250a are disposed to span from the bottom to top of the reaction tube 203 at a predetermined opening pitch. Each of the gas supply holes 250a have the same opening area. A first gas supply system is mainly constituted by the first gas supply pipe 232a, the mass flow controller 241a, the valve 243a and the first nozzle 249a. In addition, a first inert gas supply system is mainly constituted by the first inert gas supply pipe 232d, the mass flow controller 241d and the valve 243d.

A mass flow controller (MFC) 241b as a flow rate controller (a flow rate control unit) and an opening/closing valve 243b are disposed in the second gas supply pipe 232b in this order from the upstream direction. In addition, a second inert gas supply pipe 232e is connected to the downstream side of the valve 243b of the second gas supply pipe 232b. A mass flow controller (MFC) 241e as a flow rate controller (a flow rate control unit) and an opening/closing valve 243e are disposed in the second inert gas supply pipe 232e in this order from the upstream direction. In addition, the above-mentioned second nozzle 249b is connected to a leading end of the second gas supply pipe 232b. The second nozzle 249b is vertically disposed along the inner wall of the reaction tube 203 in a circular arc-shaped space between the inner wall of the reaction tube 203 and the wafers 200. The second nozzle 249b is disposed in the flank of the wafer arrangement region where the wafers 200 are arranged and horizontally surrounds the wafer arrangement region. The second nozzle 249b is configured as an L-like long nozzle and has its horizontal portion disposed to penetrate through the lower side wall of the reaction tube 203 and its vertical portion disposed to rise from at least one end of the wafer arrangement region toward the other end thereof. A plurality of gas supply holes 250b through which gas is supplied is disposed at a side surface of the second nozzle 249b. The gas supply holes 250b are opened toward the center of the reaction tube 203 to supply gas toward the wafers 200. The gas supply holes 250b are disposed to span from the bottom to top of the reaction tube 203 at a predetermined opening pitch. Each of the gas supply holes 250b have the same opening area. A second gas supply system is mainly constituted by the second gas supply pipe 232b, the mass flow controller 241b, the valve 243b and the second nozzle 249b. In addition, a second inert gas supply system is mainly constituted by the second inert gas supply pipe 232e, the mass flow controller 241e and the valve 243e.

A mass flow controller (MFC) 241c as a flow rate controller (a flow rate control unit) and an opening/closing valve 243c are disposed in the third gas supply pipe 232c in this order from the upstream direction. In addition, a third inert gas supply pipe 232f is connected to the downstream side of the valve 243c of the third gas supply pipe 232c. A mass flow controller (MFC) 241f as a flow rate controller (a flow rate control unit) and an opening/closing valve 243f are disposed in the third inert gas supply pipe 232f in this order from the upstream direction. In addition, the above-mentioned third nozzle 249c is connected to a leading end of the third gas supply pipe 232c. The third nozzle 249c is vertically disposed along the inner wall of the reaction tube 203 in a circular arc-shaped space between the inner wall of the reaction tube 203 and the wafers 200. The third nozzle 249c is disposed in the flank of the wafer arrangement region where the wafers 200 are arranged and horizontally surrounds the wafer arrangement region. The third nozzle 249c is configured as an L-like long nozzle and has its horizontal portion disposed to penetrate through the lower side wall of the reaction tube 203 and its vertical portion disposed to rise from at least one end of the wafer arrangement region toward the other end thereof. A plurality of gas supply holes 250c through which gas is supplied is disposed in a side surface of the third nozzle 249c. The gas supply holes 250c are opened toward the center of the reaction tube 203 to supply gas toward the wafers 200. The gas supply holes 250c are disposed to span from the bottom to top of the reaction tube 203 at a predetermined opening pitch. Each of the gas supply holes 250c have the same opening area. A third gas supply system is mainly constituted by the third gas supply pipe 232c, the mass flow controller 241c, the valve 243c and the third nozzle 249c. In addition, a third inert gas supply system is mainly constituted by the third inert gas supply pipe 232f, the mass flow controller 241f and the valve 243f.

In the gas supply systems, gas is transferred via the nozzles 249a, 249b and 249c arranged in the circular arc-shaped longitudinal space defined by the inner wall of the reaction tube 203 and ends of the plurality of loaded wafers 200 and supplied into the reaction tube 203 near the wafers 200 from the gas supply holes 250a, 250b and 250c opened in the nozzles 249a, 249b and 249c. The gas supplied into the reaction tube 203 mainly flows in a horizontal direction, that is, a direction in parallel to the surface of the wafers 200 in the reaction tube 203. This configuration provides an advantage of uniformly supplying the gas to the wafers 200 and forming a uniform thickness of a film on the wafers 200. Although a residual gas after the reaction flows toward the exhaustion mechanism, that is, the exhaustion pipe 231, a direction of flow of the residual gas is specified by a position of the exhaustion mechanism without being limited to the vertical direction.

Raw material gas (first raw material gas) containing, for example, a first metal element and a halogen element as a first raw material is supplied from the first gas supply pipe 232a into the process chamber 201 via the mass flow controller 241a, the valve 243a and the first nozzle 249a. Examples of the first metal element may include transition metal elements such as titanium (Ti), tantalum (Ta), hafnium (Hf), zirconium (Zr), molybdenum (Mo), tungsten (W) and the like, and examples of the halogen element may include chlorine (Cl), fluorine (F) and the like. The first raw material gas may, for example, include a raw material gas containing titanium (Ti) and chlorine (Cl), such as titanium chloride (i.e., titanium tetrachloride ($TiCl_4$)). If liquid raw material, such as $TiCl_4$, which is in a liquid state at room temperature and atmospheric pressure, is used, the liquid raw material may be supplied as raw material gas after being vaporized by a vaporizing system (not shown) such as a vaporizer or a bubbler.

Raw material gas (second raw material gas) containing, for example, a second metal element and a carbon element as a second raw material is supplied from the second gas supply pipe 232b into the process chamber 201 via the mass flow controller 241b, the valve 243b and the second nozzle 249b. Examples of the second metal element may include transition metal elements such as titanium (Ti), tantalum (Ta), hafnium (Hf), zirconium (Zr), molybdenum (Mo), tungsten (W) and the like. The second raw material gas may include a substituent, such as a methyl group, a cyclopentadienyl group, an ethyl group or the like, which contains carbon (C) and hydrogen (H). That is, the second raw material gas may be a raw material which contains a transition metal element, carbon and hydrogen. As an example, the second raw material gas may include a raw material gas, such as $Hf[C_5H_4(CH_3)]_2(CH_3)_2$ gas or the like, which contains hafnium (Hf), carbon (C) and hydrogen (H). $Hf[C_5H_4(CH_3)]_2(CH_3)_2$ is a raw material which contains a methyl group and a cyclopentadienyl group. If solid raw material, such as $Hf[C_5H_4(CH_3)]_2(CH_3)_2$, which is in a solid state at room temperature and atmospheric pressure, is used, the solid raw material may be supplied as raw material gas after being heated or dissolved in a solvent, such as ethylcyclohexane (ECH), tetrahydrofuran (THF) or the like, into a liquid state which is then vaporized by a vaporizing system (not shown) such as a vaporizer or a bubbler.

Gas (nitrogen-containing gas) which contains, for example, nitrogen (N) as a nitridation raw material is supplied from the third gas supply pipe 232c into the process chamber 201 via the mass flow controller 241c, the valve 243c and the third nozzle 249c. An example of the nitrogen-containing gas may include ammonia ($NH_3$) gas.

For example, nitrogen ($N_2$) gas is supplied from the inert gas supply pipes 232d, 232e and 232f into the process chamber 201 via the mass flow controllers 241d, 241e and 241f, the valves 243d, 243e and 243f and the nozzles 249a, 249b and 249c, respectively.

When the gases are flown from the gas supply pipes as described above, a first raw material gas supply system is constituted by the first gas supply system, a second raw material gas supply system is constituted by the second gas supply system, and a nitridation gas supply system (nitrogen-containing gas system) is constituted by the third gas supply system. When the nitridation gas is a reaction gas, a reaction gas supply system is constituted by the nitridation gas supply system. When the first raw material gas and the second raw material gas are raw material gases, a raw material gas supply system is constituted by the first raw material gas supply system and the second raw material gas supply system. In some embodiments, the first raw material gas supply system, the second raw material gas supply system and the nitridation gas supply system may be referred to as a first raw material supply system, a second raw material supply system and a nitridation raw material supply system, respectively.

The exhaustion pipe 231 to exhaust the internal atmosphere of the process chamber 201 is disposed in the reaction tube 203. As shown in FIG. 2, when viewed from a cross section, the exhaustion pipe 231 is disposed in a position opposite to a position where the gas supply holes 250a of the first nozzle 249a, the gas supply holes 250b of the second nozzle 249b and the gas supply holes 250c of the third nozzle 249c of the reaction tube 203 are disposed, that is, a position opposite to the gas supply holes 250a, 250b and 250c with the wafers 200 interposed therebetween. In addition, as shown in FIG. 1, when viewed from a longitudinal section, the exhaustion pipe 231 is disposed below a position where the gas supply holes 250a, 250b and 250c are disposed. With this configuration, gas supplied from the gas supply holes 250a, 250b and 250c to the neighborhood of the wafers 200 in the process chamber 201 flows in a horizontal direction, that is, a direction in parallel to surfaces of the wafers 200, flows downward, and then is exhausted out of the exhaustion pipe 231. The main flow of gas in the process chamber 201 becomes a flow in the horizontal direction, as described previously.

The exhaustion pipe 231 is connected with a vacuum pump 246 as a vacuum exhaustion device via a pressure sensor 245 as a pressure detector (pressure detecting part) for detecting the internal pressure of the process chamber 201 and an APC (Auto Pressure Controller) valve 244 as a pressure regulator (pressure regulating part). The APC valve 244 is a valve configured to perform vacuum exhaustion and vacuum exhaustion stop in the process chamber 201 by opening/closing the valve with the vacuum pump 246 actuated and adjust the internal pressure of the process chamber 201 by regulating a valve position with the vacuum pump 246 actuated. An exhaustion system is mainly constituted by the exhaustion pipe 231, the APC valve 244 and the pressure sensor 245. The vacuum pump 246 may be also considered to be included in the exhaustion system. The exhaustion system is configured to perform vacuum exhaustion such that the internal pressure of the process chamber 201 is set to a predetermined pressure (a degree of vacuum) by regulating the valve position of the APC valve 244 based on pressure information detected by the pressure sensor 245 while actuating the vacuum pump 246.

A seal cap 219, which functions as a furnace opening cover for air-tightly blocking the bottom opening of the reaction tube 203, is disposed below the reaction tube 203. The seal cap 219 is configured to contact the bottom of the reaction tube 203 from below in the vertical direction. The seal cap 219 is made of, for example, metal such as stainless steel or the like and has a disc shape. An O-ring 220 as a seal member contacting the bottom of the reaction tube 203 is disposed in the top side of the seal cap 219. A rotation mechanism 267 to rotate the boat 217 as a substrate support, which will be described later, is disposed below the seal cap 219. A shaft 255 of the rotation mechanism 267 is connected to the boat 217 through the seal cap 219. The rotation mechanism 267 is configured to rotate the wafers 200 by rotating the boat 217. The seal cap 219 is configured to be vertically elevated by a boat elevator 115 as an elevation mechanism vertically disposed outside the reaction tube 203. The boat elevator 115 is configured to carry the boat 217 in and out of the process chamber 201 by elevating the seal cap 219. That is, the boat elevator 115 is configured as a transfer device (transfer mechanism) to transfer the boat 217, i.e., the wafers 200, in and out of the process chamber 201.

The boat 217, which is utilized as the substrate support, is made of, for example, a heat resistant material such as quartz, silicon carbide or the like and is configured to support the wafers 200 horizontally stacked in multiple stages with the center of the wafers 200 concentrically aligned. In addition, a heat insulating member 218 made of, for example, a heat resistant material such as quartz, silicon carbide or the like is disposed below the boat 217 and is configured to make it difficult for heat from the heater 207 to be transferred to the seal cap 219. The heat insulating member 218 may be constituted by a plurality of heat insulating plates, each made of a heat resistant material such as quartz, silicon carbide or the like, and a heat insulating plate holder to support these heat insulating plates horizontally in multiple stages.

A temperature sensor 263 as a temperature detector is disposed within the reaction tube 203. Based on temperature information detected by the temperature sensor 263, a state of electric conduction to the heater 207 is adjusted such that the interior of the process chamber 201 has an intended temperature distribution. The temperature sensor 263 has a L-like shape, like the nozzles 249a, 249b and 249c and is disposed along the inner wall of the reaction tube 203.

Figure 3:
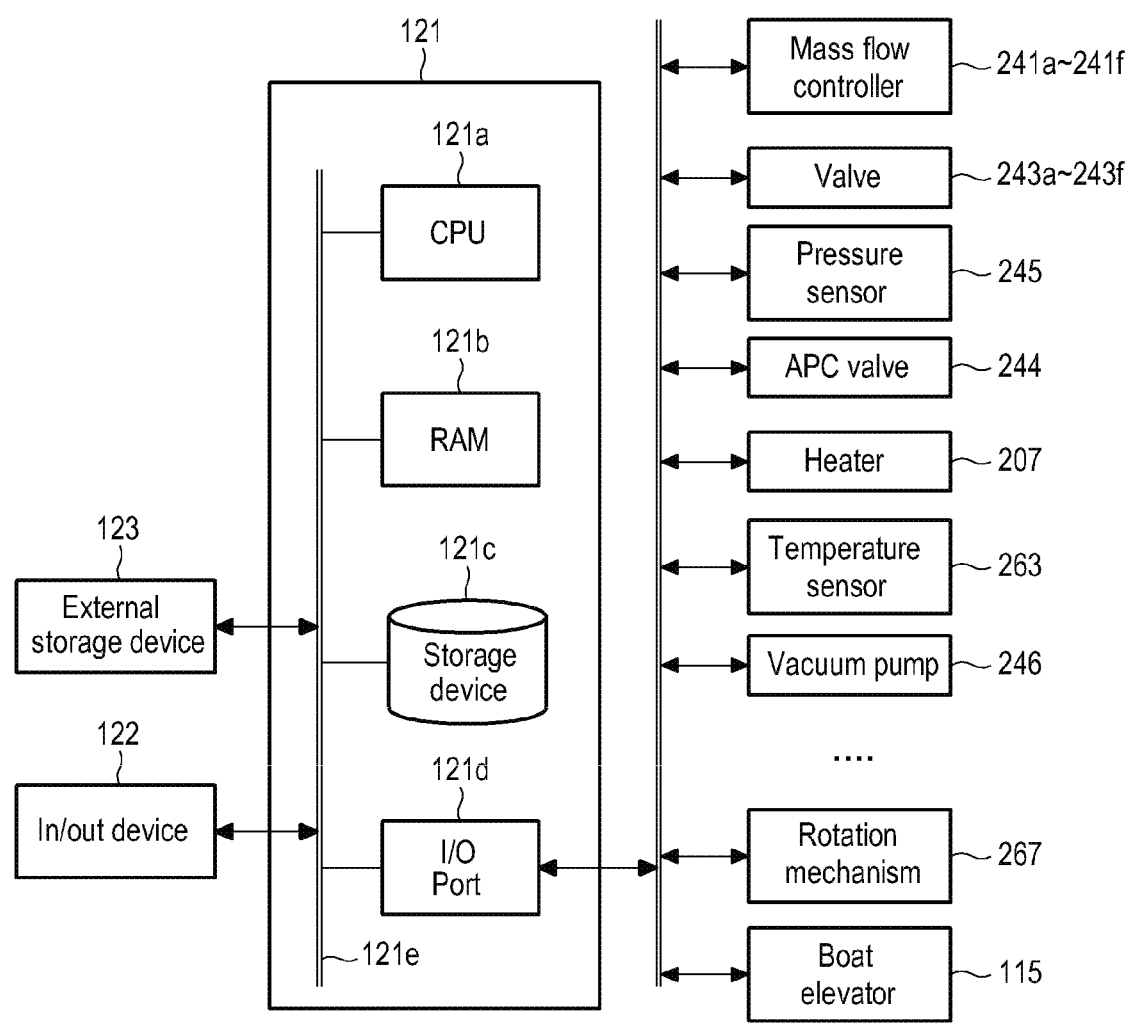
FIG. 3 is a schematic view illustrating a configuration of a controller of the substrate processing apparatus, according to some embodiments.

As shown in FIG. 3, a controller 121 as a control unit (control means) is constituted by a computer including a CPU (Central Processing Unit) 121a, a RAM (Random Access Memory) 121b, a storage device 121c and an I/O port 121d. The RAM 121b, the storage device 121c and the I/O port 121d are configured to exchange data with the CPU 121a via an internal bus 121e. An input/output device 122 constituted by, for example, a touch panel or the like is connected to the controller 121.

The storage device 121c is constituted by, for example, a flash memory, a HDD (Hard Disk Drive) or the like. Control programs to control an operation of the substrate processing apparatus and process recipes describing substrate processing procedures and conditions, which will be described later, are readably loaded (stored) in the storage device 121c. The process recipes function as programs to cause the controller 121 to execute procedures in substrate processing which will be described later. Hereinafter, these process recipes and control programs are collectively simply referred to as programs. As used herein, the term "programs" may be intended to include process recipes only, control programs only, or both thereof. The RAM 121b is configured as a memory area (work area) in which programs and data read by the CPU 121a are temporarily stored.

The I/O port 121d is connected to the above-mentioned mass flow controllers 241a, 241b, 241c, 241d, 241e and 241f, valves 243a, 243b, 243c, 243d, 243e and 243f, pressure sensor 245, APC valve 244, vacuum pump 246, heater 207, temperature sensor 263, rotation mechanism 267, boat elevator 115 and so on.

The CPU 121a is configured to read and execute a control program from the storage device 121c and read a process recipe from the storage device 121c according to an operation command input from the input/output device 122. The CPU 121a is further configured to control a flow rate adjustment operation of various gases by the mass flow controllers 241a, 241b, 241c, 241d, 241e and 241f, an opening/closing operation of the valves 243a, 243b, 243c, 243d, 243e and 243f, an opening/closing operation of the APC valve 244, a pressure adjustment operation by the APC valve 244 based on the pressure sensor 245, a temperature adjustment operation of the heater 207 based on the temperature sensor 263, start and stop of the vacuum pump 246, rotation and a rotation speed adjustment operation of the boat 217 by the rotation mechanism 267, an elevation operation by the boat elevator 115, etc., according to contents of the read process recipe.

The controller 121 may be configured as a general-purpose computer without being limited to a dedicated computer. For example, in the embodiment, the controller 121 may be configured by preparing an external storage device (for example, a magnetic tape, a magnetic disk such as a flexible disk or a hard disk, an optical disk such as CD or DVD, a magneto-optical disk such as MO, and a semi-conductor memory such as a USB memory or a memory card) 123 which stores the above-described programs and installing the programs from the external storage device 123 into the general-purpose computer. A means for providing the programs for the computer is not limited to the case where the programs are provided through the external storage device 123. For example, the programs may be provided using a communication means such as Internet, a dedicated line or the like, without the external storage device 123. The storage device 121c and the external storage device 123 are implemented with a computer readable recording medium and will be hereinafter collectively simply referred to as a recording medium. The term "recording medium" may include the storage device 121c only, the external storage device 123 only, or both thereof.

(2) Substrate Processing

As one of processes of manufacturing a semiconductor device using the vertical treatment furnace 202 of the above-described substrate processing apparatus, an example of sequence of forming a metal carbonitride film on a substrate will be now described. In the following description, operations of various components constituting the substrate processing apparatus are controlled by the controller 121.

<First Sequence>

Figure 4:
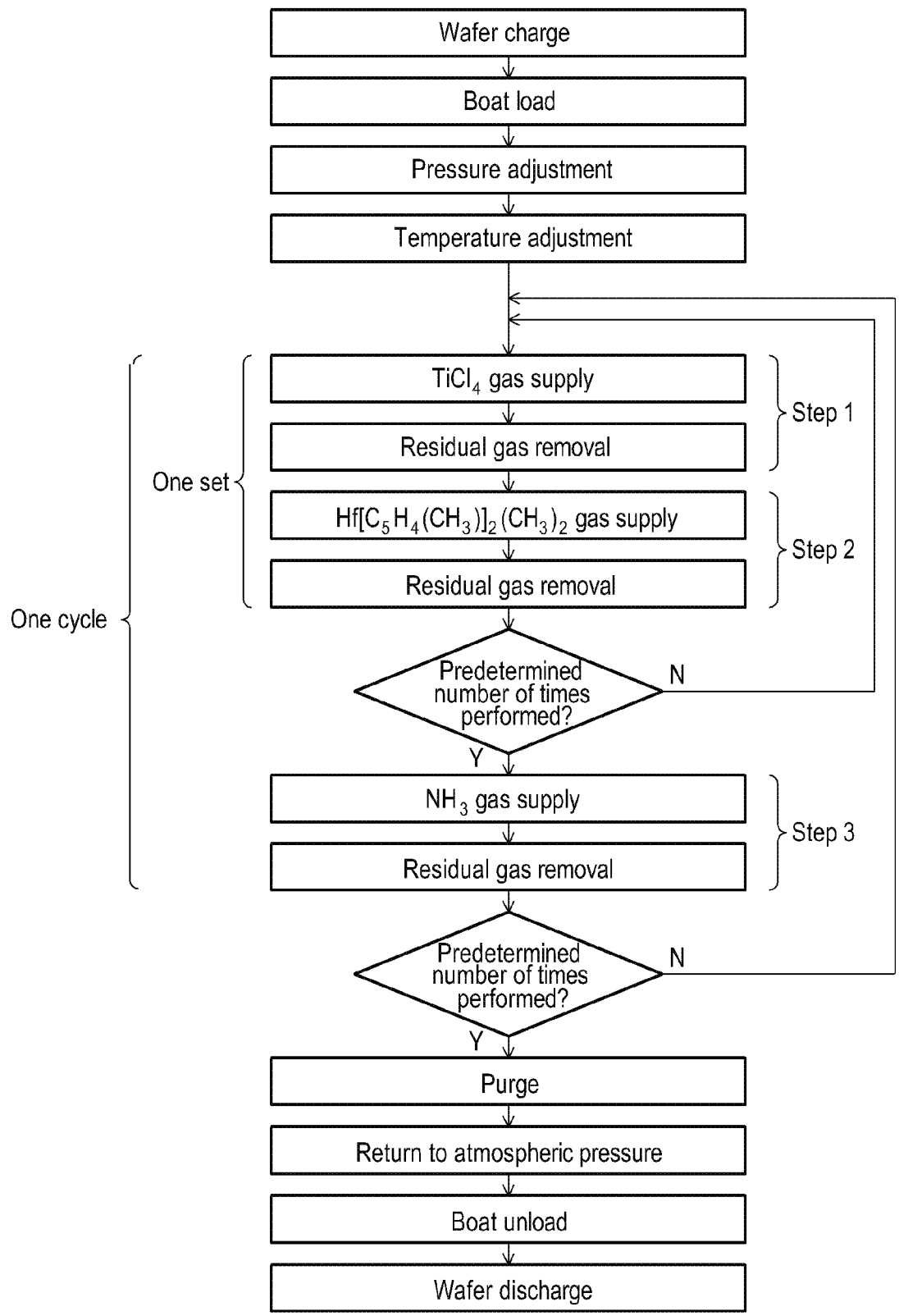
FIG. 4 is a view illustrating a flow of film formation in a first sequence according to some embodiments.
Figure 6:
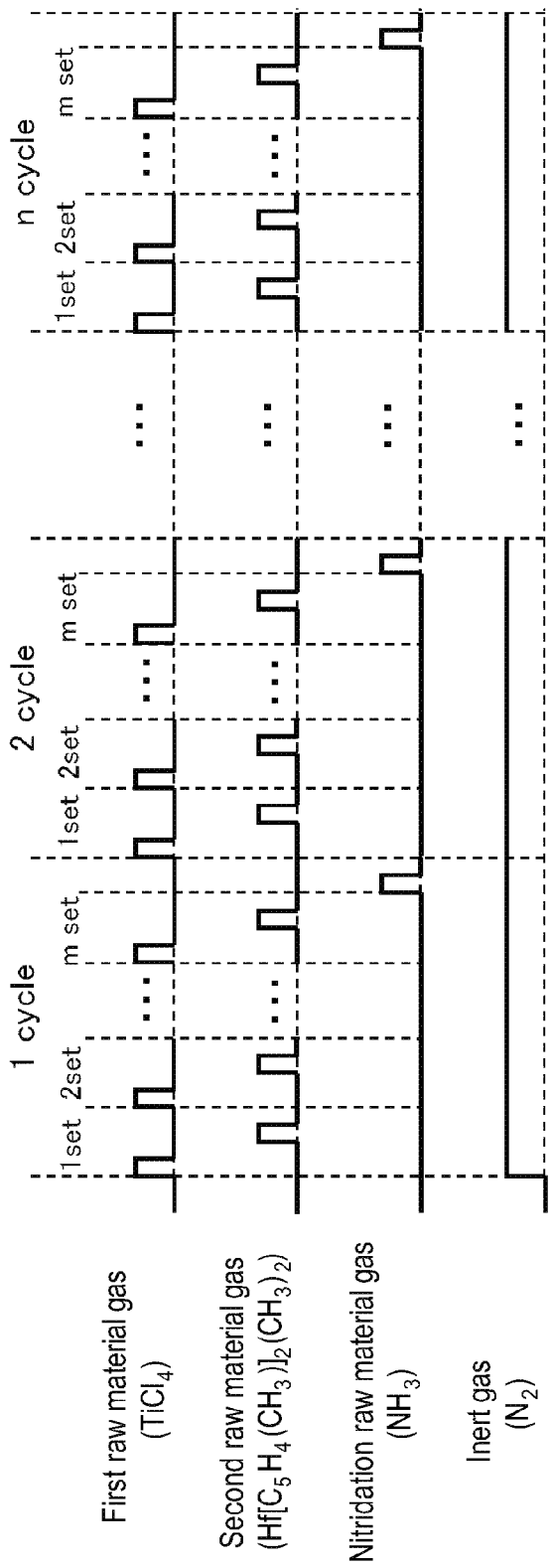
FIG. 6 is a view illustrating timings of gas supply in the first sequence according to some embodiments.

A first sequence of a substrate processing according to some embodiments will be first described. FIG. 4 is a view illustrating a flow of film formation in a first sequence of a substrate processing, according to some embodiments. FIG. 6 is a view illustrating timings of gas supply in the first sequence.

In the first sequence, a titanium carbonitride film (TiCN film) having a predetermined thickness is formed on a wafer 200 by alternately performing (i) a first process of alternately supplying a first raw material, which contains titanium (Ti) and chlorine (Cl), and a second raw material, which contains hafnium (Hf) and carbon, to the wafer 200 in the process chamber 201 by a first predetermined number of times to form a titanium carbide layer (TiC layer), which contains titanium (Ti) and carbon (C), on the wafer 200, and (ii) a second process of supplying a nitridation raw material to the wafer 200 in the process chamber 201 to form a titanium carbonitride layer (TiCN layer), which contains titanium, carbon and nitrogen, by nitrating the TiC layer, by a second predetermined number of times.

As used herein, the phrase "alternately supplying a first raw material and a second raw material by a first predetermined number of times" may refer to performing a set of supply of a first raw material and a second raw material once or more than once. That is, this phrase may refer to performing this set one or more number of times. For example, in some embodiments this set may be performed more than once in order to obtain a TiCN film having a relatively high concentration of C. Increase in the number of times for performance of this set may lead to increase in the concentration of C in the TiCN film. In other embodiments, this set may be performed by the decreased number of times (for example, once) in order to obtain a TiCN film having a relatively low concentration of C.

As used herein, the phrase "alternately performing a first process of alternately supplying a first raw material and a second raw material by a first predetermined number of times and a second process of supplying a nitridation raw material, by a second predetermined number of times" may refer to including performing one cycle of a first process of alternately supplying a first raw material and a second raw material by the first predetermined number of times and a second process of supplying a nitridation raw material, either once or more than once. That is, this phrase means performing this cycle one or more number of times.

FIGS. 4 and 6 are examples of supplying the first raw material to the wafer 200 in the process chamber 201 to form the TiC layer and then supplying the second raw material. In other words, FIGS. 4 and 6 illustrate examples of supplying the first raw material earlier than the second raw material. However, the order of supplying the first raw material and the second raw material is not limited to these examples. For example, the second raw material may be supplied earlier than the first raw material.

The first sequence of the substrate processing will be described below in further detail. In this example, TiCl$_4$ gas, Hf[C$_5$H$_4$(CH$_3$)]$_2$(CH$_3$)$_2$ gas and NH$_3$ gas may be used for the first raw material, the second raw material and the nitridation raw material, respectively, and the titanium carbonitride film (TiCN film) may be formed as a metal carbonitride film on the wafer 200 according to the film formation flow of FIG. 4 and the film formation sequence of FIG. 6.

As used herein, the term "metal film" means a film made of a conductive material which contains a metal element, including, but not limited to, a conductive metal film made of metal only, a conductive metal nitride film, a conductive metal oxide film, a conductive metal oxynitride film, a conductive metal composite film, a conductive metal ally film, a conductive metal silicide film, a conductive metal carbide film, a conductive metal carbonitride film, etc. The titanium carbonitride film is one type of the conductive metal carbonitride film and the titanium carbide film is one type of the conductive metal carbide film.

<Wafer Charge and Boat Load>

When a plurality of wafers 200 is loaded on the boat 217 (wafer charge), the boat 217 supporting the plurality of wafers 200 is lifted and loaded into the process chamber 201 by the boat elevator 115 (boat load). In this state, the seal cap 219 seals the bottom of the reaction tube 203 via the O-ring 220.

<Pressure Adjustment and Temperature Adjustment>

The interior of the process chamber 201 is vacuum-exhausted by the vacuum pump 246 to set the interior to a desired pressure (degree of vacuum). At this time, the internal pressure of the process chamber 201 is measured by the pressure sensor 245 and the APC valve 244 is feedback-controlled based on the measured pressure information (pressure adjustment). The vacuum pump 246 remains activated at least until the wafers 200 are completely processed. The interior of the process chamber 201 is heated by the heater 207 to set the interior to a desired temperature. At this time, a state of electric conduction to the heater 207 is feedback-controlled based on the temperature information detected by the temperature sensor 263 such that the interior of the process chamber 201 has a desired temperature distribution (temperature adjustment). The heating of the interior of the process chamber 201 by the heater 207 continues at least until the wafers 200 are completely processed. Subsequently, the boat 217 and the wafers 200 begin to be rotated by the rotation mechanism 267. The rotation of the boat 217 and the wafers 200 by the rotation mechanism 267 continues at least until the wafers 200 are completely processed. Thereafter, the following three steps are sequentially performed.

<Step 1>
<$TiCl_4$ Gas Supply>

The valve 243a of the first gas supply pipe 232a is opened to flow $TiCl_4$ gas into the first gas supply pipe 232a. A flow rate of the $TiCl_4$ gas flowing into the first gas supply pipe 232a is regulated by the mass flow controller 241a. The $TiCl_4$ gas with its flow rate regulated is supplied from the gas supply hole 250a of the first nozzle 249a into the process chamber 201 and is exhausted from the exhaustion pipe 231. At this time, the $TiCl_4$ gas is supplied to the wafers 200. At the same time, the valve 243d is opened to flow inert gas such as $N_2$ gas or the like into the first inert gas supply pipe 232d. A flow rate of the $N_2$ gas flowing into the first inert gas supply pipe 232d is regulated by the mass flow controller 241d. The $N_2$ gas with its flow rate regulated is supplied into the process chamber 201, along with the $TiCl_4$ gas, and is exhausted from the exhaustion pipe 231. At this time, in order to prevent the $TiCl_4$ gas from being introduced into the second nozzle 249b and the third nozzle 249c, the valves 243e and 243f are opened to flow the $N_2$ gas into the second inert gas supply pipe 232e and the third inert gas supply pipe 232f. The $N_2$ gas is supplied into the process chamber 201 via the second gas supply pipe 232b, the third gas supply pipe 232c, the second nozzle 249b and the third nozzle 249c and is exhausted from the exhaustion pipe 231.

At this time, the APC valve 244 is appropriately regulated to set the internal pressure of the process chamber 201 to fall within a range of, for example, 10 to 2000 Pa. The flow rate of $TiCl_4$ gas controlled by the mass flow controller 241a is set to fall within a range of, for example, 10 to 2000 sccm. The flow rates of $N_2$ gases controlled by the mass flow controllers 241d, 241e and 241f are set to fall within a range of, for example, 100 to 10000 sccm. Time period during which the $TiCl_4$ gas is supplied to the wafers 200, that is, gas supply time (irradiation time), is set to fall within a range of, for example, 0.1 to 120 seconds. At this time, the heater 207 is set to a temperature such that the temperature of the wafers 200 is set to fall within a range of, for example, 200 to 450 degrees C. If the temperature of the wafers 200 is less than 200 degrees C., a TiC layer formed by alternately performing Step 1 and Step 2, which will be described later, by the predetermined number of times, does not react with $NH_3$ supplied in Step 3, which will be described later, thereby preventing a TiCN layer from being formed in Step 3. If the temperature of the wafers 200 exceeds 450 degrees C., a gas phase reaction becomes dominant, which may result in deteriorated uniformity of film thickness and difficulty in control thereof. Thus, in some embodiments, temperature of the wafers 200 will mainly fall within a range of 200 to 450 degrees C.

The supply of $TiCl_4$ gas results in formation of a titanium-containing layer having a thickness of, for example, less than one atomic layer to several atomic layers on underlayers on surfaces of the wafers 200. The titanium-containing layer may be a $TiCl_4$ chemical adsorption layer or a titanium layer (Ti layer) or both thereof. In this example, the titanium-containing layer may be a layer which contains titanium (Ti) and chlorine (Cl).

In this example, the titanium layer includes a continuous layer made of titanium (Ti), a discontinuous layer, or a titanium thin film composed of a combination of these continuous and discontinuous layers. The continuous layer made of Ti is sometimes referred to as a titanium thin film. Ti of which the titanium layer is made includes one which is not completely decoupled from Cl.

The $TiCl_4$ chemical adsorption layer includes a $TiCl_4$ molecule continuous chemical adsorption layer and a $TiCl_4$ molecule discontinuous chemical adsorption layer. That is, the $TiCl_4$ chemical adsorption layer includes a chemical adsorption layer having a thickness of one molecular layer or less constituted by $TiCl_4$ molecules. The $TiCl_4$ molecules constituting the $TiCl_4$ chemical adsorption layer include those ($TiCl_x$ molecules) in which Ti is partially decoupled from Cl. That is, the $TiCl_4$ chemical adsorption layer includes $TiCl_4$ molecule and/or $TiCl_x$ continuous and discontinuous chemical adsorption layers. As used herein, the phrase "layer having a thickness of less than one atomic layer" means an atomic layer discontinuously formed and the phrase "layer having a thickness of one atomic layer" means an atomic layer continuously formed. Similarly, the phrase "layer having a thickness of less than one molecular layer" means a molecular layer discontinuously formed and the phrase "layer having a thickness of one molecular layer" means a molecular layer continuously formed.

Under the condition where the $TiCl_4$ gas is self-decomposed (pyrolyzed), that is, under the condition where a pyrolytic reaction of the $TiCl_4$ gas is produced, Ti is deposited on the wafers 200, thereby forming the titanium layer. Under the condition where the $TiCl_4$ gas is not self-decomposed (pyrolyzed), that is, under the condition where no pyrolytic reaction of the $TiCl_4$ gas is produced, the $TiCl_4$ gas is chemically absorbed and deposited on the wafers 200, thereby forming the $TiCl_4$ gas chemical adsorption layer. Forming the $TiCl_4$ gas chemical adsorption layer on the wafers 200 can provide a higher film formation rate than forming the titanium layer on the wafers 200.

If the thickness of the titanium-containing layer formed on the wafers 200 exceeds several atomic layers, nitridation reaction in Step 3, which will be described later, may not occur in the entire titanium-containing layer. The minimum of thickness of the titanium-containing layer which can be formed on the wafers 200 is less than one atomic layer. Accordingly, the thickness of the titanium-containing layer may be set to fall within a range of less than one atomic layer to several atomic layers. When the thickness of the titanium-containing layer is not less than one atomic layer, i.e., one atomic layer or less, nitridation reaction in Step 3, which will be described later, can be relatively expedited and time required for the nitridation reaction in Step 3 can be shortened. Time required for the formation of the titanium-containing layer in Step 1 can be also shortened. As a result, processing time per cycle and hence total processing time can be shortened. In other words, a film formation rate can be increased. In addition, when the thickness of the titanium-containing layer is not less than one atomic layer, controllability for uniform film thickness can be improved.

<Residual Gas Removal>

After the titanium-containing layer is formed, the valve 243a of the first gas supply pipe 232a is closed to stop the supply of the TiCl$_4$ gas. At this time, with the APC valve 244 of the exhaustion pipe 231 opened, the interior of the process chamber 201 is vacuum-exhausted by the vacuum pump 246 and unreacted TiCl$_4$ gas remaining in the process chamber 201 or TiCl$_4$ gas which remains after contributing to the formation of the titanium-containing layer is excluded from the process chamber 201. At this time, with the valves 243d, 243e and 243f opened, the supply of the N$_2$ gas into the process chamber 201 is maintained. The N$_2$ gas acts as purge gas which is capable of further improving the effect of excluding the unreacted TiCl$_4$ gas remaining in the process chamber 201 or the TiCl$_4$ gas which remains after contributing to the formation of the titanium-containing layer from the process chamber 201.

The residual gas in the process chamber 201 may not be completely excluded and the interior of the process chamber 201 may not be completely purged. If an amount of the residual gas in the process chamber 201 is very small, this has no adverse effect on the subsequent Step 2. In this case, there is no need to provide a high flow rate of N$_2$ gas supplied into the process chamber 201. For example, the same volume of N$_2$ gas as the reaction tube 203 (the process chamber 201) may be supplied into the process chamber 201 to purge the interior of the process chamber 201 to such a degree that this has no adverse effect on Step 2. In this way, when the interior of the process chamber 201 is not completely purged, purge time can be shortened, thereby improving a throughput. This can also limit consumption of N$_2$ gas to the minimum required for purging.

Examples of the first raw material gas may include raw material gas, which contains titanium (Ti) and fluorine (F), such as titanium fluoride, i.e., tetrafluoride (TiF$_4$), and the like, in addition to TiCl$_4$ gas. Examples of the inert gas may include rare gases such as Ar gas, He gas, Ne gas, Xe gas and the like, in addition to N$_2$ gas.

<Step 2>
<Hf[C$_5$H$_4$(CH$_3$)]$_2$(CH$_3$)$_2$ Gas Supply>

After Step 1 is completed to remove the residual gas from the process chamber 201, the valve 243b of the second gas supply pipe 232b is opened to flow Hf[C$_5$H$_4$(CH$_3$)]$_2$(CH$_3$)$_2$ gas into the second gas supply pipe 232b. A flow rate of the Hf[C$_5$H$_4$(CH$_3$)]$_2$(CH$_3$)$_2$ gas flowing into the second gas supply pipe 232b is regulated by the mass flow controller 241b. The Hf[C$_5$H$_4$(CH$_3$)]$_2$(CH$_3$)$_2$ gas with its flow rate regulated is supplied from the gas supply hole 250b of the second nozzle 249b into the process chamber 201 and is exhausted from the exhaustion pipe 231. At this time, the Hf[C$_5$H$_4$(CH$_3$)]$_2$(CH$_3$)$_2$ gas is supplied to the wafers 200. At the same time, the valve 243e is opened to flow N$_2$ gas or the like into the second inert gas supply pipe 232e. A flow rate of the N$_2$ gas flowing into the second inert gas supply pipe 232e is regulated by the mass flow controller 241e. The N$_2$ gas with its flow rate regulated is supplied into the process chamber 201, along with the Hf[C$_5$H$_4$(CH$_3$)]$_2$(CH$_3$)$_2$ gas, and is exhausted from the exhaustion pipe 231. At this time, in order to prevent the Hf[C$_5$H$_4$(CH$_3$)]$_2$(CH$_3$)$_2$ gas from being introduced into the first nozzle 249a and the third nozzle 249c, the valves 243d and 243f are opened to flow the N$_2$ gas into the first inert gas supply pipe 232d and the third inert gas supply pipe 232f. The N$_2$ gas is supplied into the process chamber 201 via the first gas supply pipe 232a, the third gas supply pipe 232c, the first nozzle 249a and the third nozzle 249c and is exhausted from the exhaustion pipe 231.

At this time, the APC valve 244 is appropriately regulated to set the internal pressure of the process chamber 201 to fall within a range of, for example, 10 to 2000 Pa, as in Step 1. The flow rate of Hf[C$_5$H$_4$(CH$_3$)]$_2$(CH$_3$)$_2$ gas controlled by the mass flow controller 241b is set to fall within a range of, for example, 10 to 2000 sccm. The flow rates of N$_2$ gases controlled by the mass flow controllers 241e, 241d and 241f are set to fall within a range of, for example, 100 to 10000 sccm. The time period during which the Hf[C$_5$H$_4$(CH$_3$)]$_2$(CH$_3$)$_2$ gas is supplied to the wafers 200, that is, gas supply time (irradiation time), is set to fall within a range of, for example, 0.1 to 120 seconds. At this time, the heater 207 is set to a temperature such that the temperature of the wafers 200 is set to fall within a range of, for example, 200 to 450 degrees C., as in Step 1.

The supply of Hf[C$_5$H$_4$(CH$_3$)]$_2$(CH$_3$)$_2$ gas results in reaction of the titanium-containing layer (the TiCl$_4$ and/or TiCl$_x$ chemical adsorption layer or the Ti layer) formed on the wafers 200 in Step 1 with the Hf[C$_5$H$_4$(CH$_3$)]$_2$(CH$_3$)$_2$ gas. At this time, a gaseous material is mainly produced by reaction of chlorine (Cl) in the titanium-containing layer formed on the wafers 200 in Step 1 with the Hf[C$_5$H$_4$(CH$_3$)]$_2$ in the Hf[C$_5$H$_4$(CH$_3$)]$_2$(CH$_3$)$_2$ gas and is discharged as gas. At this time, chlorine (Cl) in the titanium-containing layer may react with a methyl group (CH$_3$) or a cyclopentadienyl group (C$_5$H$_4$) in the Hf[C$_5$H$_4$(CH$_3$)]$_2$(CH$_3$)$_2$ gas. In this case, as the Hf[C$_5$H$_4$(CH$_3$)]$_2$(CH$_3$)$_2$ is decomposed, hafnium (Hf) and hydrogen (H) in Hf[C$_5$H$_4$(CH$_3$)]$_2$(CH$_3$)$_2$ may react with Cl in the titanium-containing layer to produce a gaseous material to be discharged as gas. In this way, in Step 2, Cl in TiCl$_4$ and Hf in Hf[C$_5$H$_4$(CH$_3$)]$_2$(CH$_3$)$_2$ are transformed into a gaseous material to be discharged. That is, Cl in TiCl$_4$ and Hf in Hf[C$_5$H$_4$(CH$_3$)]$_2$(CH$_3$)$_2$ are transformed into a gaseous material, which contains Cl, and a gaseous material, which contains Hf, and/or a gaseous material, which contains Cl and Hf, all of which are to be discharged. The remaining Cl and Hf which are not discharged as gas are transformed into a gaseous material to be discharged as gas when TiCl$_4$ gas is supplied in Step 1 to be performed next. During these processes, some of carbons (C) decoupled from hydrogen (H) and some of methyl groups (CH$_3$) separated from hydrogen by the decomposition of the Hf[C$_5$H$_4$(CH$_3$)]$_2$(CH$_3$)$_2$ gas remain without being discharged as gas and are bonded to Ti in the titanium-containing layer. This allows the titanium-containing layer to be modified as a titanium carbide layer (TiC layer) which contains Ti and C. The TiC layer becomes a layer which contains Ti and C having a thickness of less than one atomic layer to several atomic layers.

<Residual Gas Removal>

Thereafter, the valve 243b of the second gas supply pipe 232b is closed to stop the supply of the Hf[C$_5$H$_4$(CH$_3$)]$_2$(CH$_3$)$_2$ gas. At this time, with the APC valve 244 of the exhaustion pipe 231 opened, the interior of the process chamber 201 is vacuum-exhausted by the vacuum pump 246 and unreacted Hf[C$_5$H$_4$(CH$_3$)]$_2$(CH$_3$)$_2$ gas remaining in the process chamber 201 or Hf[C$_5$H$_4$(CH$_3$)]$_2$(CH$_3$)$_2$ gas which remains after contributing to the formation of the TiC layer, and reactive by-products are excluded from the process chamber 201. At this time, with the valves 243e, 243d and 243f opened, the supply of the N$_2$ gas into the process chamber 201 is maintained. The N$_2$ gas acts as purge gas which is capable of further improving the effect of excluding the unreacted Hf[C$_5$H$_4$(CH$_3$)]$_2$(CH$_3$)$_2$ gas remaining in the process chamber 201 or the Hf[C$_5$H$_4$(CH$_3$)]$_2$(CH$_3$)$_2$ gas which remains after contributing to the formation of the titanium-containing layer, and the reactive by-products from the process chamber 201.

The residual gas in the process chamber 201 may not be completely excluded and the interior of the process chamber 201 may not be completely purged. If an amount of the residual gas in the process chamber 201 is very small, this has no adverse effect on the subsequent Step 3. In this case, there is no need to provide a high flow rate of $N_2$ gas supplied into the process chamber 201. For example, the same volume of $N_2$ gas as the reaction tube 203 (the process chamber 201) may be supplied into the process chamber 201 to purge the interior of the process chamber 201 to such a degree that this has no adverse effect on Step 3. In this way, when the interior of the process chamber 201 is not completely purged, purge time can be shortened, thereby improving a throughput. This can also limit consumption of $N_2$ gas to the minimum required for purging.

Examples of the second raw material gas may include $Zr[C_5H_4(CH_3)]_2(CH_3)_2$ gas and the like in addition to $Hf[C_5H_4(CH_3)]_2(CH_3)_2$ gas. Examples of the second raw material gas may also include raw material gas which contains an ethyl group $(C_2H_5)$ reacting with chlorine, in addition to the raw material gas which contains the methyl group $(CH_3)$ and the cyclopentadienyl group $(C_5H_4)$ reacting with chlorine, such as $Hf[C_5H_4(CH_3)]_2(CH_3)_2$ gas. For example, the second raw material may be tetrakis(methylethylamino)hafnium $(Hf[N(C_2H_5)(CH_3)]_4$, abbreviated as TEMAHf) gas, tetrakis(methylethylamino)zirconium $(Zr[N(C_2H_5)(CH_3)]_4$, abbreviated as TEMAZr) gas, tetrakis(dimethylamino)hafnium $(Hf[N(CH_3)_2]_4$, abbreviated as TDMAHf) gas, tetrakis(dimethylamino)titanium $(Ti[N(CH_3)_2]_4$, abbreviated as TDMATi) gas, trimethylaluminum $(Al(CH_3)_3$, abbreviated as TMA) and the like. In order to provide the above-described reaction with high efficiency, a raw material gas may be used that contains the methyl group $(CH_3)$ and the cyclopentadienyl group $(C_5H_4)$, such as the $Hf[C_5H_4(CH_3)]_2(CH_3)_2$ gas or the $Zr[C_5H_4(CH_3)]_2(CH_3)_2$ gas. The TEMAHf gas and the TEMAZr gas are raw material gas containing a methyl group and an amino group. TMA gas is raw material gas containing a methyl group. It may be said that the $Hf[C_5H_4(CH_3)]_2(CH_3)_2$ gas, the $Zr[C_5H_4(CH_3)]_2(CH_3)_2$ gas and the TMA gas are nitrogen-free raw material gas in that they contain no nitrogen. The second raw material gas may be an unstable raw material gas. Examples of the inert gas may include rare gases such as Ar gas, He gas, Ne gas, Xe gas and the like, in addition to $N_2$ gas.

Thereafter, a TiC layer having a predetermined thickness is formed by performing one set of the above-described Steps 1 and 2 by the predetermined number of times. FIG. 6 shows that this set is performed m times. The number of times m of performance of the set is, for example, 1 to 200, 1 to 100, or 1 to 20. More specifically, the number of times m of performance of the set may be several or 2 to 6. Controlling (adjusting) the number of times m of performance of the set makes it possible to control a concentration of C in a TiCN film to be finally formed. In order to obtain a TiCN film having a relatively high C concentration, the set may be performed several times rather than once. For example, in order to form a TiCN film as a gate electrode having a C concentration of 5 to 20 at %, set may be performed several times. Increase in the number of times of performance of the set can lead to increase in the C concentration of the TiCN film. In order to obtain a TiCN film having a relatively low C concentration, the number of times m of performance of the set may be small (for example, one).

<Step 3>
<$NH_3$ Gas Supply>

After the TiC layer having the predetermined thickness is formed and the residual gas in the process chamber 201 is removed, the valve 243c of the third gas supply pipe 232c is opened to flow $NH_3$ gas into the third gas supply pipe 232c. A flow rate of the $NH_3$ gas flowing into the third gas supply pipe 232c is regulated by the mass flow controller 241c. The $NH_3$ gas with its flow rate regulated is supplied from the gas supply hole 250c of the third nozzle 249c into the process chamber 201. The $NH_3$ gas supplied into the process chamber 201 is activated by heat and is exhausted from the exhaustion pipe 231. At this time, the $NH_3$ gas activated by the heat is supplied to the wafers 200. At the same time, the valve 243f is opened to flow $N_2$ gas into the third inert gas supply pipe 232f. A flow rate of the $N_2$ gas flowing into the third inert gas supply pipe 232f is regulated by the mass flow controller 241f. The $N_2$ gas is supplied into the process chamber 201, along with the $NH_3$ gas, and is exhausted from the exhaustion pipe 231. At this time, in order to prevent the $NH_3$ gas from being introduced into the first nozzle 249a and the second nozzle 249b, the valves 243d and 243e are opened to flow the $N_2$ gas into the first inert gas supply pipe 232d and the second inert gas supply pipe 232e. The $N_2$ gas is supplied into the process chamber 201 via the first gas supply pipe 232a, the second gas supply pipe 232b, the first nozzle 249a and the second nozzle 249b and is exhausted from the exhaustion pipe 231.

When the $NH_3$ gas is activated by the heat and is flown, the APC valve 244 is appropriately regulated to set the internal pressure of the process chamber 201 to fall within a range of, for example, 10 to 2000 Pa. By setting the internal pressure of the process chamber 201 to such a relatively high pressure, it becomes possible to thermally activate the $NH_3$ gas with non-plasma. In addition, the thermally activated $NH_3$ gas is supplied to produce a soft reaction to soften nitridation which will be described later. A flow rate of $NH_3$ gas controlled by the mass flow controller 241c is set to fall within a range of, for example, 10 to 2000 sccm. Flow rates of $N_2$ gases controlled by the mass flow controllers 241f, 241d and 241e are set to fall within a range of, for example, 100 to 10000 sccm. The time period during which the thermally activated $NH_3$ gas is supplied to the wafers 200, that is, gas supply time (irradiation time), is set to fall within a range of, for example, 0.1 to 120 seconds. At this time, the heater 207 is set to a temperature such that the temperature of the wafers 200 is set to fall within a range of, for example, 200 to 450 degrees C., as in Steps 1 and 2.

At this time, gas flowing into the process chamber 201 is the $NH_3$ gas activated thermally by increasing the internal pressure of the process chamber 201 into which neither $TiCl_4$ gas nor $Hf[C_5H_4(CH_3)]_2(CH_3)_2$ gas is flown. Accordingly, the activated $NH_3$ gas reacts with at least a portion of the TiC layer which is formed on the wafers 200 in Step 2 and contains Ti and C, without causing any gas phase reaction. This allows the TiC layer to be nitrided and modified into a titanium carbonitride layer (TiCN layer).

In addition, when the TiC layer is thermally nitrided by the thermally activated $NH_3$ gas and modified (changed) into the TiCN layer, the TiC layer is modified into the TiCN layer while adding nitrogen (N) to the TiC layer. At this time, a Ti—N bond in the TiC layer is increased by action of the thermal nitridation by the $NH_3$ gas. That is, the TiC layer can be modified into the TiCN layer while changing a composition ratio in a manner to increase a nitrogen concentration. In addition, by controlling process conditions such as the internal pressure of the process chamber 201, the gas supply time and so on, it is possible to finely adjust a percentage of nitrogen (N) in the TiCN layer, i.e., the nitrogen concentration and more minutely control the composition ratio of the TiCN layer.

At this time, the nitridation reaction of the TiC layer is not saturated. For example, when the TiC layer having a thickness of less than one atomic layer to several atomic layers is formed in Steps 1 and 2, a portion of the TiC layer may be nitrided. In this case, the nitridation is performed under the condition where the nitridation reaction of the TiC layer is unsaturated to prevent the entire TiC layer having the thickness of less than one atomic layer to several atomic layers from being nitrided. In order to prevent the nitridation reaction of the TiC layer from being saturated, the process conditions in Step 3 may be set as the above-mentioned condition.

<Residual Gas Removal>

Thereafter, the valve 243c of the third gas supply pipe 232c is closed to stop the supply of the $NH_3$ gas. At this time, with the APC valve 244 of the exhaustion pipe 231 opened, the interior of the process chamber 201 is vacuum-exhausted by the vacuum pump 246 and unreacted $NH_3$ gas remaining in the process chamber 201 or $NH_3$ gas which remains after contributing to the formation of the TiCN layer, and reactive by-products are excluded from the process chamber 201. At this time, with the valves 243f, 243d and 243e opened, the supply of the $N_2$ gas into the process chamber 201 is maintained. The $N_2$ gas acts as purge gas which is capable of further improving the effect of excluding the unreacted $NH_3$ gas remaining in the process chamber 201 or the $NH_3$ gas which remains after contributing to the formation of the titanium-containing layer, and the reactive by-products from the process chamber 201.

The residual gas in the process chamber 201 may not be completely excluded and the interior of the process chamber 201 may not be completely purged. If an amount of the residual gas in the process chamber 201 is very small, this has no adverse effect on the subsequent Step 1. In this case, there is no need to provide a high flow rate of $N_2$ gas supplied into the process chamber 201. For example, the same volume of $N_2$ gas as the reaction tube 203 (the process chamber 201) may be supplied into the process chamber 201 to purge the interior of the process chamber 201 to such a degree that this has no adverse effect on Step 1. In this way, when the interior of the process chamber 201 is not completely purged, purge time can be shortened, thereby improving a throughput. This can also limit consumption of $N_2$ gas to the minimum required for purging.

Examples of the nitridation raw material may include diazene ($N_2H_2$) gas, hydrazine ($N_2H_4$) gas, $N_3H_8$ gas and the like, in addition to the $NH_3$ gas. In addition, these gases may be diluted with rare gases such as Ar gas, He gas, Ne gas, Xe gas and the like.

Thereafter, a titanium carbonitride film (TiCN film) having a predetermined composition and thickness is formed on the wafers 200 by performing a cycle of a first process of alternately performing Steps 1 and 2 by a first predetermined number of times and a second process of performing Step 3, by a second predetermined number of times. FIG. 6 shows that this cycle may be performed n cycles as the second predetermined number of times. Controlling (adjusting) the number of times n of performance of the cycle makes it possible to control a thickness of a TiCN film to be finally formed. For example, in order to form a TiCN film as a gate electrode having a C concentration of 5 to 20 at % and a thickness of 0.1 to 50 nm, the number of times n of performance of the cycle falls within a range of 1 to 500. This cycle may be performed once or several times rather than once. That is, a thickness of the TiCN layer formed per cycle may be set to be smaller than a desired thickness and the cycle may be repeated several times until the TiCN layer reaches the desired thickness. In this way, by setting the thickness of the TiCN layer formed per cycle to be small and repeating the cycle several times, it is possible to effect an action of nitridation performed in Step 3 on the entire TiC layer. In addition, it is possible to nitride the TiCN film more uniformly and more uniformalize the concentration of N in the TiCN film in the thickness direction.

<Purge and Return to Atmospheric Pressure>

Once the film formation process of forming the TiCN film having the predetermined composition and thickness is completed, inert gas such as $N_2$ or the like is supplied into the process chamber 201 and is exhausted from the exhaustion pipe 231 such that the interior of the process chamber 201 is purged by the inert gas (gas purge). Thereafter, the internal atmosphere of the process chamber 201 is substituted with the inert gas (inert gas substitution) and the internal pressure of the process chamber 201 returns to the atmospheric pressure (return to atmospheric pressure).

<Boat Unload and Wafer Discharge>

Thereafter, the seal cap 219 is descended by the boat elevator 115 to open the bottom of the reaction tube 203 while carrying the processed wafers 200 from the bottom of the reaction tube 203 out of the reaction tube 203 with them supported by the boat 217 (boat unload). Thereafter, the processed wafers 200 are discharged out of the boat 217 (wafer discharge).

<Second Sequence>

Next, a second sequence of a substrate processing according to some embodiments will be described.

Figure 5:
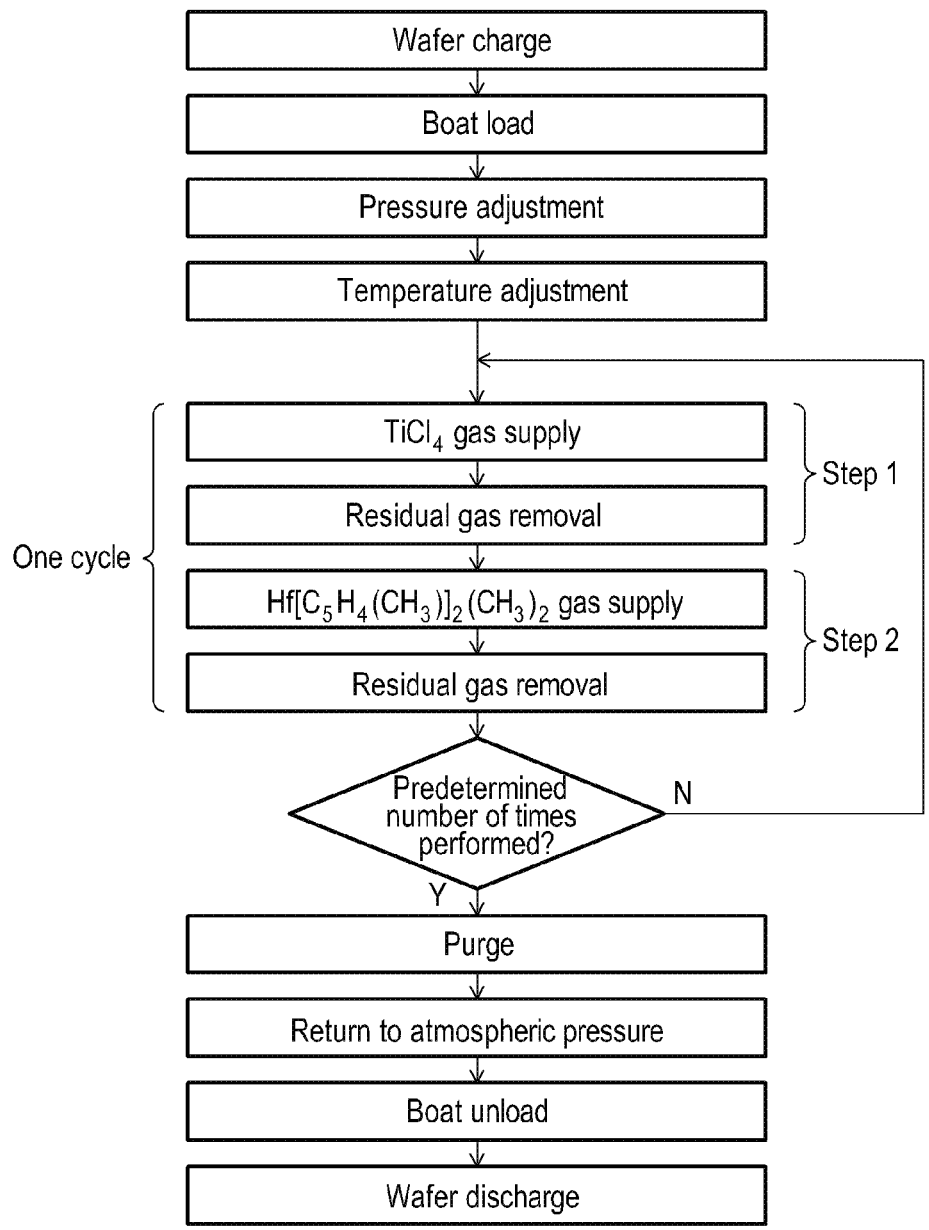
FIG. 5 is a view illustrating a flow of film formation in a second sequence according to some embodiments.
Figure 7:
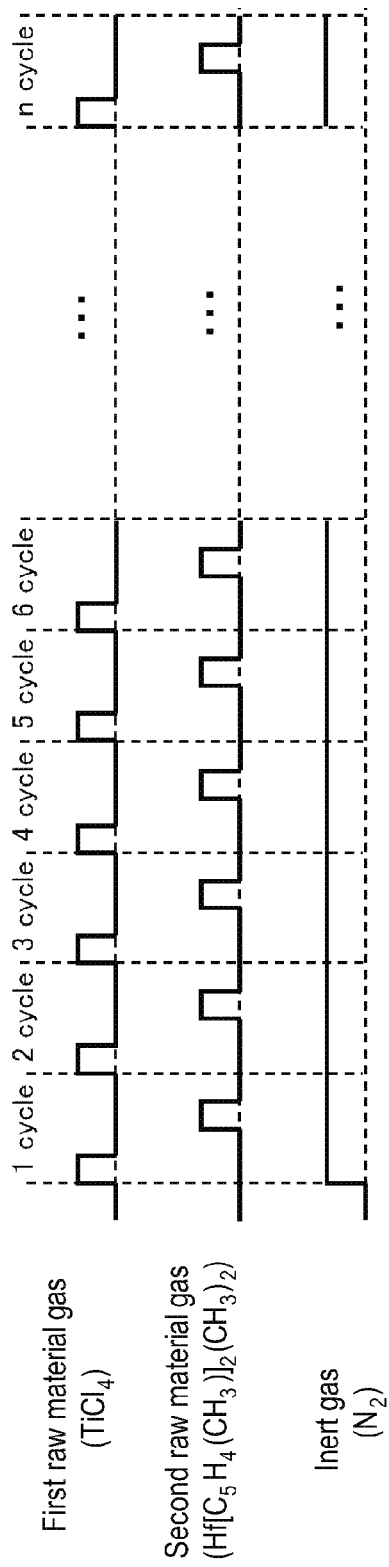
FIG. 7 is a view illustrating timings of gas supply in the second sequence according to some embodiments.

FIG. 5 is a view illustrating a flow of film formation in the second sequence of the substrate processing. FIG. 7 is a view illustrating timings of gas supply in the second sequence.

In the second sequence, a titanium carbide film (TiC film) which contains titanium and carbon is formed on a wafer 200 by alternately supplying a first raw material, which contains titanium (Ti) and chlorine (Cl), and a second raw material, which contains hafnium (Hf) and carbon (C), to the wafer 200 in the process chamber 201 by the predetermined number of times. That is, in the second sequence, a TiC film having a predetermined composition and thickness is formed on the wafer 200 by performing a cycle of Steps 1 and 2 by the predetermined number n of times without performing Step 3 in the first sequence. This sequence is equal to the first sequence except that the former does not perform Step 3. In addition, this sequence may have the same process conditions as the first sequence.

(3) Certain Advantages

According to the first and second sequences, the TiCN film or the TiC film can be formed with high step coverage unlike a deposition method such as a sputtering method. That is, the TiCN film or the TiC film can be formed with high step coverage on a three-dimensional structure requiring step coverage.

In addition, according to the first sequence of the embodiment, by controlling (adjusting) the number of times m of performance of a set of Steps 1 and 2, it is possible to adjust a concentration of carbon and nitrogen in the TiC film and form the TiCN film having desired characteristics while controlling a composition ratio. In addition, in order to obtain a TiCN film having a relatively high C concentration, the set may be performed several times rather than once. For example, in order to form a TiCN film as a gate electrode having a C concentration of 5 to 20 at %, this set can be performed several times. Increase in the number of times of performance of the set can lead to increase in the C concentration of the TiCN film, thereby relatively decreasing a N concentration. In addition, in order to obtain a TiCN film having a relatively low C concentration, the number of times m of performance of the set may be small (for example, one). That is, according to the first sequence of the substrate processing method, it is possible to control the C concentration of the TiCN film over a wide range from a high concentration to a low concentration.

In addition, according to the first sequence, by controlling (adjusting) the number of times n of performance of a cycle of a process of alternately performing Steps 1 and 2 by the predetermined number of times and a process of performing Step 3, it is possible to control a thickness of the TiC film. Similarly, also in the second sequence of the embodiment, by controlling (adjusting) the number of times n of performance of a cycle of Steps 1 and 2, it is possible to control the thickness of the TiC film.

In addition, according to the first sequence, by setting a thickness of the TiCN layer formed per cycle to be smaller than a desired thickness and repeating the cycle several times until the TiCN layer reaches the desired thickness, it is possible to effect an action of nitridation performed in Step 3 on the entire TiC layer. In addition, it is possible to nitride the TiCN film more uniformly and more uniformalize the concentration of N in the TiCN film in the thickness direction.

Although various embodiments have been described in the above, the present disclosure is not limited to these disclosed embodiments.

For example, it may be suitably applied to form metal carbonitride films such as a tantalum carbonitride film (TaCN film), a hafnium carbonitride film (HfCN film), zirconium carbonitride film (ZrCN film), molybdenum carbonitride film (MoCN film), tungsten carbonitride film (WCN film) and the like, metal carbide films such as a tantalum carbide film (TaC film), a hafnium carbide film (HfC film), zirconium carbide film (ZrC film), molybdenum carbide film (MoC film), tungsten carbide film (WC film) and the like, and silicide films such as a TiSiC film, a TaSiC film, a HfSiC film, a ZrSiC film, a MoSiC film, a WSiC film and the like which are formed by adding silicon (Si) to these metal carbide films.

Additional examples include, in case where the TaCN film is formed, $TaCl_5$ or $TaF_5$ used as the first raw material, $Hf[C_5H_4(CH_3)]_2(CH_3)_2$ used as the second raw material and $NH_3$ used as the nitridation raw material. In addition, for example, in case where the HfCN film is formed, $HfCl_4$ or $HfF_4$ is used as the first raw material, $Hf[C_5H_4(CH_3)]_2(CH_3)_2$ is used as the second raw material and $NH_3$ is used as the nitridation raw material. In addition, for example, in case where the ZrCN film is formed, $ZrCl_4$ or $ZrF_4$ is used as the first raw material, $Hf[C_5H_4(CH_3)]_2(CH_3)_2$ is used as the second raw material and $NH_3$ is used as the nitridation raw material. In addition, for example, in case where the MoCN film is formed, $MoCl_5$ or $MoF_5$ is used as the first raw material, $Hf[C_5H_4(CH_3)]_2(CH_3)_2$ is used as the second raw material and $NH_3$ is used as the nitridation raw material. In addition, for example, in case where the WCN film is formed, $WCl_6$ or $WF_6$ is used as the first raw material, $Hf[C_5H_4(CH_3)]_2(CH_3)_2$ is used as the second raw material and $NH_3$ is used as the nitridation raw material. In addition, these cases may have the same film formation sequence and process conditions as the first sequence of the above-described embodiment.

In addition, for example, in case where the TaC film is formed, $TaCl_5$ or $TaF_5$ is used as the first raw material and $Hf[C_5H_4(CH_3)]_2(CH_3)_2$ is used as the second raw material. In addition, for example, in case where the HfC film is formed, $HfCl_4$ or $HfF_4$ is used as the first raw material and $Hf[C_5H_4(CH_3)]_2(CH_3)_2$ is used as the second raw material. In addition, for example, in case where the ZrC film is formed, $ZrCl_4$ or $ZrF_4$ is used as the first raw material and $Hf[C_5H_4(CH_3)]_2(CH_3)_2$ is used as the second raw material. In addition, for example, in case where the MoC film is formed, $MoCl_5$ or $MoF_5$ is used as the first raw material and $Hf[C_5H_4(CH_3)]_2(CH_3)_2$ is used as the second raw material. In addition, for example, in case where the WC film is formed, $WCl_6$ or $WF_6$ is used as the first raw material and $Hf[C_5H_4(CH_3)]_2(CH_3)_2$ is used as the second raw material. In addition, these cases may have the same film formation sequence and process conditions as the second sequence of the above-described embodiment.

In addition, in case where the TiSiC film, the TaSiC film, the HfSiC film, the ZrSiC film, the MoSiC film and the WSiC film are formed, film formation sequences to form the TiSiC film, the TaSiC film, the HfSiC film, the ZrSiC film, the MoSiC film and the WSiC film may further include a process of supplying a raw material, which contains silicon, as the third raw material (silane raw material). Examples of the silane raw material may include chlorosilanes such as monochlorosilane ($SiH_3Cl$, abbreviated as MCS), hexachlorosilane ($Si_2Cl_6$, abbreviated as HCDS), tetrachlorosilane, i.e., silicon tetrachloride ($SiCl_4$, abbreviated as STC), trichlorosilane ($SiHCl_3$, abbreviated as TCS), dichlorosilane ($SiH_2Cl_2$, abbreviated as DCS) and the like, inorganic raw materials such as trisilane ($Si_3H_8$, abbreviated as TS), disilane ($Si_2H_6$, abbreviated as DS), monosilane ($SiH_4$, abbreviated as MS) and the like, and organic raw materials such as aminosilanes, for example, tetrakisdimethylaminosilane ($Si[N(CH_3)_2]_4$, abbreviated as 4DMAS), trisdimethylaminosilane ($Si[N(CH_3)_2]_4H$, abbreviated as 3DMAS), bisdiethylaminosilane ($Si[N(C_2H_5)_2]_2H_2$, abbreviated as 2DEAS), bistertiarybutylaminosilane ($SiH_2[NH(C_4H_9)]_2$, abbreviated as BTBAS) and the like. In addition, these cases may have the same process conditions as one or more of the above-described embodiments.

In addition, although the example of alternately supplying the first raw material and the second raw material to the wafers 200 in the process chamber 201 to form the TiCN layer or the TiC film has been described in the above embodiments, the first raw material and the second raw material may be simultaneously supplied to cause a CVD reaction. This case may also have the same process conditions as the sequences of the above-described embodiment. The simultaneous supply of the first raw material and the second raw material to the wafers 200 in the process chamber 201 can also provide the same operation and effects as the above-described embodiment. However, the alternate supply of the first raw material and the second raw material as in the above embodiment, that is, the alternate supply of the first raw material and the second raw material with purge in the process chamber 201 therebetween, can cause a proper reaction between the first raw material and the second raw material under the condition of dominant surface reaction and increase controllability of film thickness.

In addition, although the example of forming the films using the batch type substrate processing apparatus to process a plurality of substrates at once has been described in the above embodiment, the present disclosure is not limited thereto but may be suitably applied to film formation using a single type substrate processing apparatus to process a single substrate or several substrates at once.

In addition, the above embodiments, modifications and applications may be used in proper combinations.

In addition, the present disclosure may be implemented by change of process recipes of an existing substrate processing apparatus, for example. The change of process recipes may include installing the process recipes of the present disclosure in the existing substrate processing apparatus via a telecommunication line or a recording medium storing the process recipes, and operating the existing substrate processing apparatus to change its process recipes into the process recipes of one or more of the embodiments described.

EXAMPLES

Example 1

Figure 8:
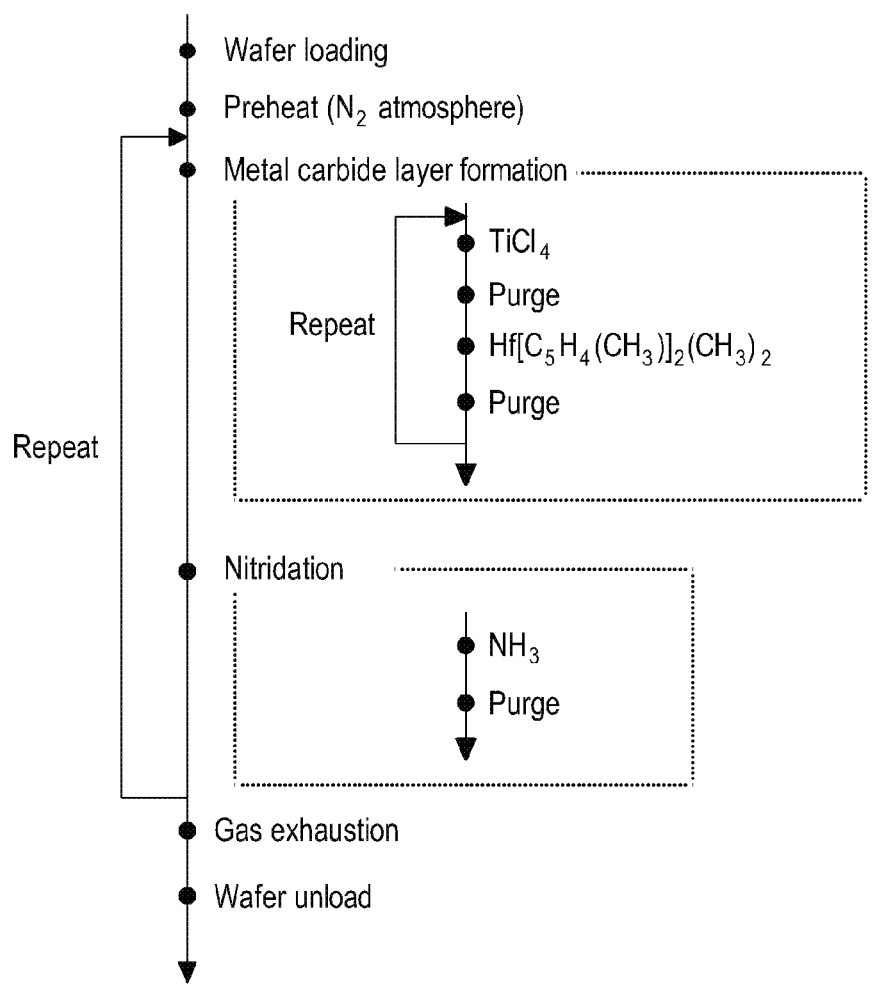
FIG. 8 is a view illustrating a flow of film formation in a first example, according to some embodiments.
Figure 9:
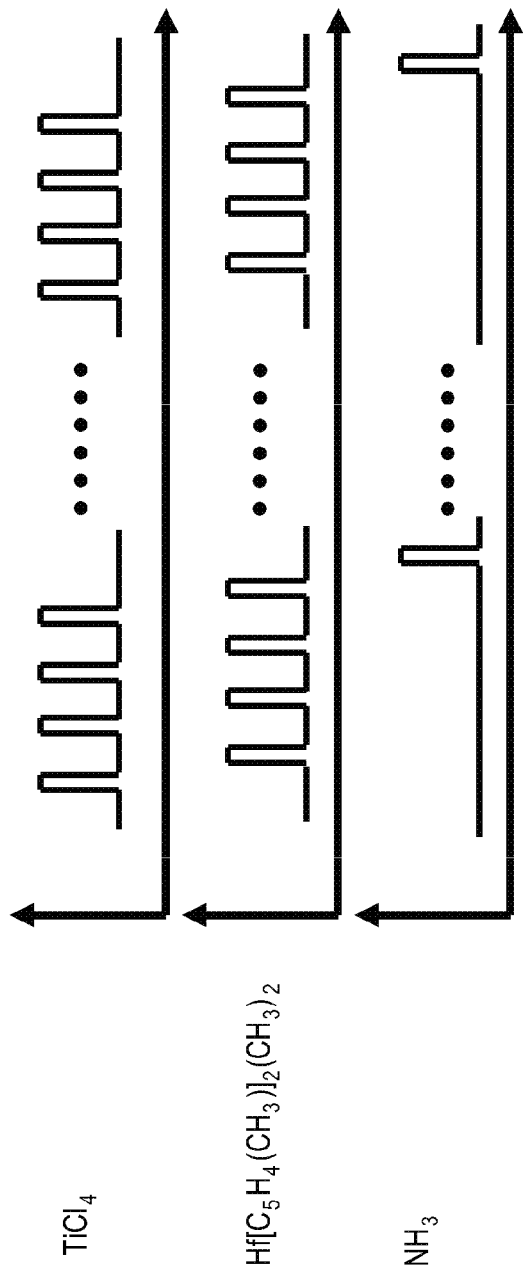
FIG. 9 is a view illustrating timings of gas supply in a first example, according to some embodiments.

An XPS analysis was performed on a TiCN film formed on a wafer according to the first sequence in the above embodiment. In this example, $TiCl_4$ gas was used as the first raw material gas, $Hf[C_5H_4(CH_3)]_2(CH_3)_2$ gas was used as the second raw material and $NH_3$ gas is used as the nitridation raw material to form the TiCN film according to the film formation flow of FIG. 8 and the gas supply timings of FIG. 9. That is, the wafer was carried in the process chamber (wafer loading), the wafer was heated under the $N_2$ atmosphere (preheat), a TiCN film was formed by alternately performing formation of a TiC layer by alternately performing supply of the $TiCl_4$ gas and the $Hf[C_5H_4(CH_3)]_2(CH_3)_2$ gas (metal carbide layer formation) and irradiation of the formed TiC layer with $NH_3$ (nitridation process), residual materials in the process chamber are exhausted (gas exhaustion), and the wafer with the TiCN film is carried out of the process chamber (wafer unload) and was subjected to the XPS analysis. Process conditions for each step at that time were set as follows. In addition, for reference, a TiN film was subjected to XPS analysis in the same way.

Figure 10A:
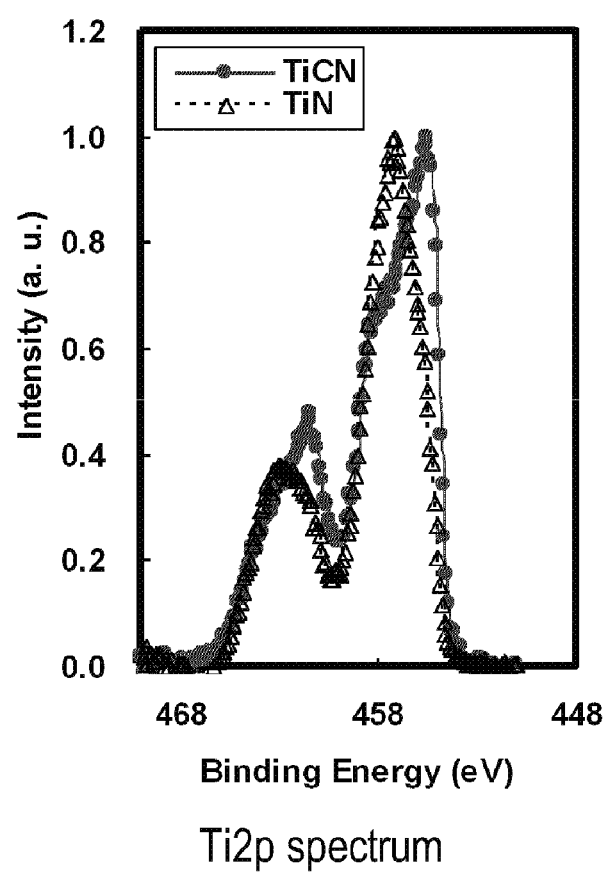
FIGS. 10A to 10C are views illustrating results of measurement of an XRF spectrum in a first example, according to some embodiments.
Figure 10B:
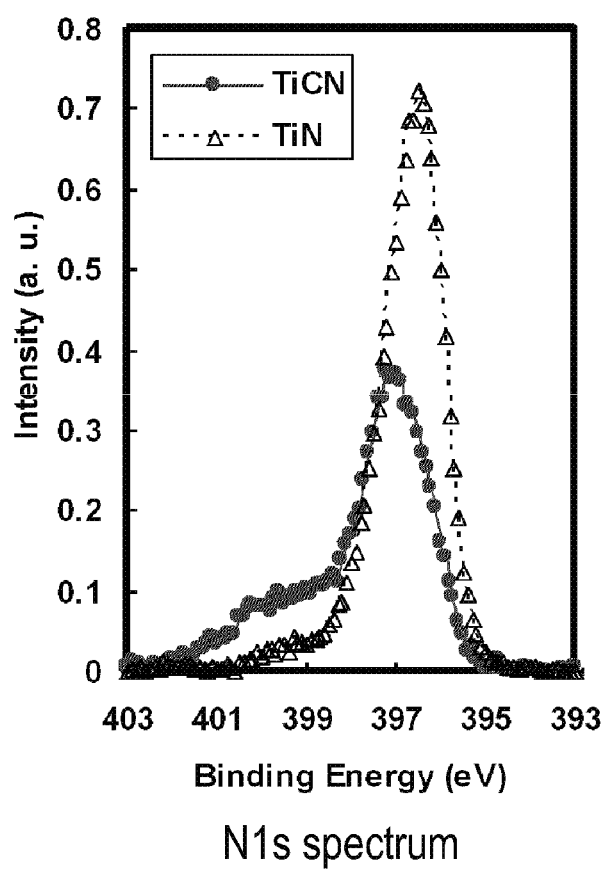
Figure 10C:
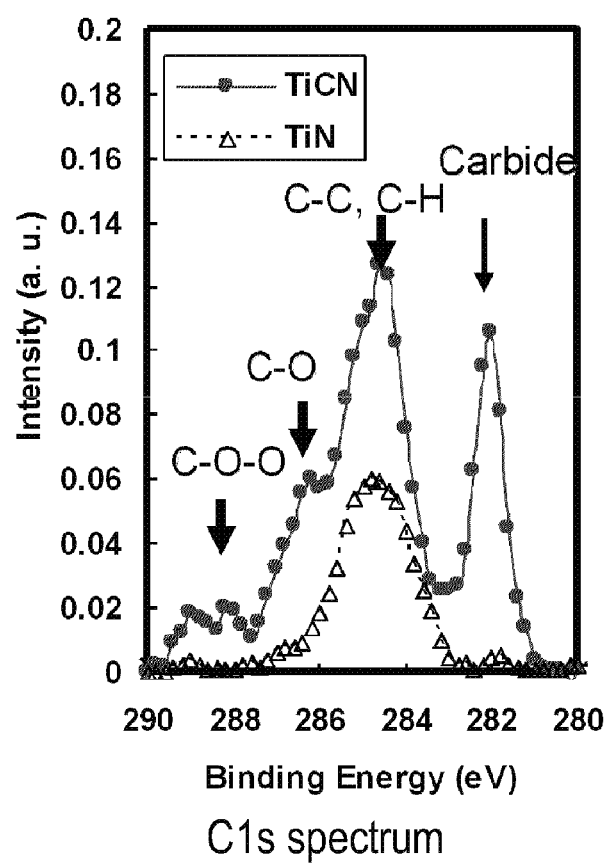

<Step 1>
  Internal temperature of process chamber: 350° C.
  Internal pressure of process chamber: 600 Pa (5 Torr)
  Flow rate of $TiCl_4$ gas: 300 sccm
  Irradiation time of $TiCl_4$ gas: 0.2 second
<Step 2>
  Internal temperature of process chamber: 350° C.
  Internal pressure of process chamber: 600 Pa (5 Torr)
  Flow rate of $Hf[C_5H_4(CH_3)]_2(CH_3)_2$ gas: 20 sccm
  Irradiation time of $Hf[C_5H_4(CH_3)]_2(CH_3)_2$ gas: 0.1 second
<Step 3>
  Internal temperature of process chamber: 350° C.
  Internal pressure of process chamber: 600 Pa (5 Torr)
  Flow rate of $NH_3$ gas: 500 sccm
  Irradiation time of $NH_3$ gas: 5 to 20 seconds FIGS. 10A to 10C are views illustrating results of measurement of an XPS spectrum according to this example, FIG. 10A showing a result of measurement of a Ti2p spectrum, FIG. 10B showing a result of measurement of a N1s spectrum and FIG. 10C showing a result of measurement of a C1s spectrum. In FIGS. 10A to 10C, a vertical axis represents bonding energy [eV] and a vertical axis represent measured intensity [a.u.]. A symbol • (indicated by a solid line) represents a result of measurement of the TiCN film according to this example and a symbol Δ represents a result of measurement of the TiN layer for reference.

It can be seen from the measurement result shown in FIG. 10A that a peak indicating the existence of Ti is detected for both of the TiCN film according to this example and the TiN film for reference, which means that Ti is contained in these films. It can be seen from the measurement result shown in FIG. 10B that a peak indicating the existence of N is detected for both of the TiCN film according to this example and the TiN film for reference, which means that N is contained in these films. It can be seen from the measurement result shown in FIG. 10C that a peak is detected near 282.0 eV in the TiCN film according to this example, which means that Ti—C bonding exists in this film. It can be seen from these results that Ti, C and N are contained in the TiCN film according to this example. Peaks near 284.8 eV, 286.5 eV, 289.0 eV detected from the TiCN film indicate the existence of C—C, C—H, C—O and C—O—O bondings, which are detected from organic matters adhered to the surface of the TiCN film. A peak near 285 eV detected from the TiN film does not indicate the existence of C in the film but is derived from a contaminant organic matter adhered to the surface of the TiN film.

Example 2

Figure 11:
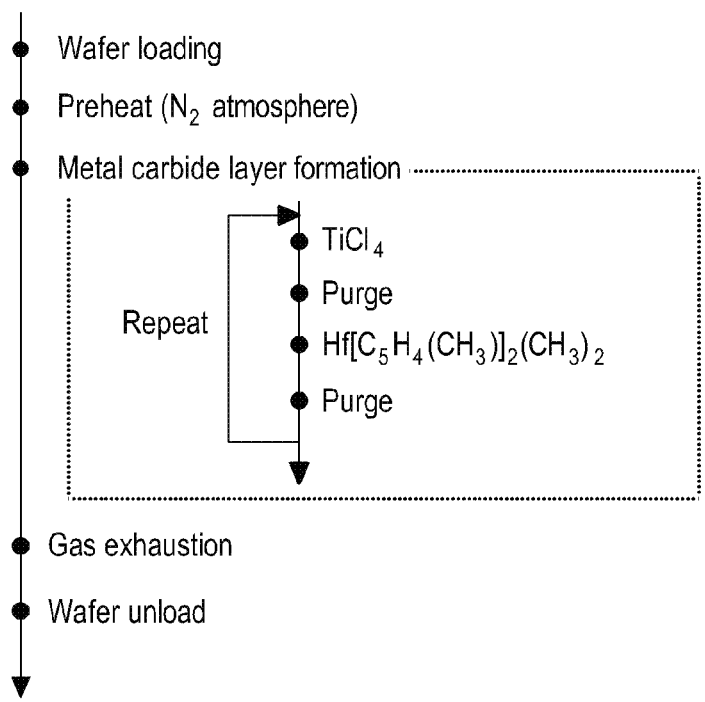
FIG. 11 is a view illustrating timings of gas supply in a second example, according to some embodiments.

An XPS analysis was made on a TiC film formed on a wafer according to the second sequence in the above embodiment. In this example, $TiCl_4$ gas was used as the first raw material gas and $Hf[C_5H_4(CH_3)]_2(CH_3)_2$ gas was used as the second raw material to form the TiC film according to the film formation flow of FIG. 11 and the gas supply timings of FIG. 12. That is, the wafer was carried in the process chamber (wafer loading), the wafer was heated under the $N_2$ atmosphere (preheat), a TiC film was formed by alternately supplying the $TiCl_4$ gas and the $Hf[C_5H_4(CH_3)]_2(CH_3)_2$ gas (metal carbide film formation), residual materials in the process chamber are exhausted (gas exhaustion), and the wafer with the TiC film is carried out of the process chamber (wafer unload) and was subjected to the XPS analysis. Process conditions for each step at that time were set as follows.

Figure 13A:
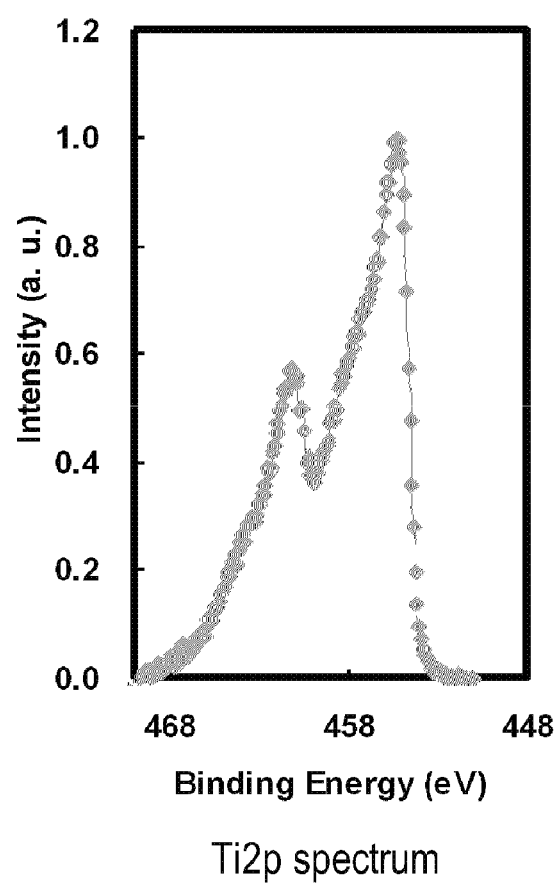
FIGS. 13A and 13B are views illustrating results of measurement of an XRF spectrum in a second example, according to some embodiments.
Figure 13B:
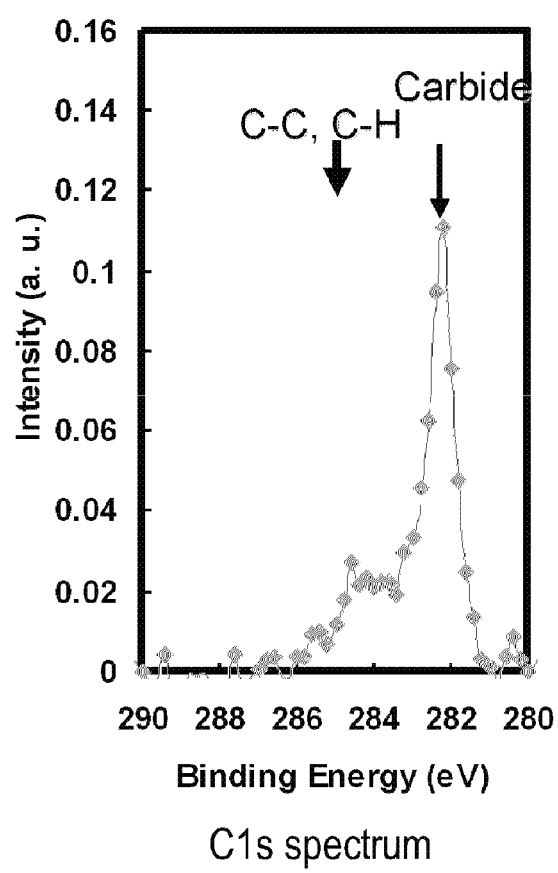

<Step 1>
  Internal temperature of process chamber: 350° C.
  Internal pressure of process chamber: 600 Pa (5 Torr)
  Flow rate of $TiCl_4$ gas: 300 sccm
  Irradiation time of $TiCl_4$ gas: 0.2 second
<Step 2>
  Internal temperature of process chamber: 350° C.
  Internal pressure of process chamber: 600 Pa (5 Torr)
  Flow rate of $Hf[C_5H_4(CH_3)]_2(CH_3)_2$ gas: 20 sccm
  Irradiation time of $Hf[C_5H_4(CH_3)]_2(CH_3)_2$ gas: 0.1 second FIGS. 13A and 13B are a view illustrating results of measurement of an XPS spectrum according to this example, FIG. 13A showing a result of measurement of a Ti2p spectrum and FIG. 13B showing a result of measurement of a C1s spectrum. In FIGS. 13A and 13B, a vertical axis represents bonding energy [eV] and a vertical axis represent measured intensity [a.u.].

It can be seen from the measurement result shown in FIG. 13A that a peak indicating the existence of Ti is detected for the TiC film according to this example, which means that Ti is contained in the film. It can be seen from the measurement result shown in FIG. 13B that a peak is detected near 282.0 eV in the TiC film according to this example, which means that Ti—C bonding exists in this film. It can be seen from these results that Ti and C are contained in the TiC film according to this example. A peak near 284.8 eV detected from the TiC film indicates the existence of C—C and C—H bondings which are derived from an organic matter adhered to the surface of the TiC film.

Additional Aspects of Present Disclosure

Hereinafter, some aspects of the present disclosure will be additionally stated.

A first aspect of the present disclosure may provide a method of manufacturing a semiconductor device, including: alternately performing (i) a first step of alternately supplying a first raw material containing a first metal element and a halogen element and a second raw material containing a second metal element and carbon to a substrate by a first predetermined number of times, and (ii) a second step of supplying a nitridation raw material to the substrate, by a second predetermined number of times, wherein alternating the first and second steps forms a metal carbonitride film containing the first metal element having a predetermined thickness on the substrate.

In some embodiments, the first metal element is a transition metal element.

In some embodiments, the first metal element includes at least one element selected from a group consisting of titanium, tantalum, hafnium, zirconium, molybdenum and tungsten.

In some embodiments, the first metal element includes titanium.

In some embodiments, the halogen element includes chlorine or fluorine.

In some embodiments, the halogen element includes chlorine.

In some embodiments, the first raw material includes $TiCl_4$.

In some embodiments, the second metal element includes a transition metal element.

In some embodiments, the second metal element includes at least one element selected from a group consisting of titanium, tantalum, hafnium, zirconium, molybdenum and tungsten.

In some embodiments, the second metal element includes hafnium.

In some embodiments, the second raw material includes a methyl group.

In some embodiments, the second raw material includes a cyclopentadienyl group.

In some embodiments, the second raw material includes an ethyl group.

In some embodiments, the second raw material includes $Hf[C_5H_4(CH_3)]_2(CH_3)_2$.

In some embodiments, each of the first metal element and the second metal element is a transition metal element.

In some embodiments, each of the first metal element and the second metal element includes at least one element selected from a group consisting of titanium, tantalum, hafnium, zirconium, molybdenum and tungsten.

In some embodiments, the first metal element includes titanium and the second metal element includes hafnium.

In some embodiments, the first step of alternately supplying the first raw material and the second raw material by the first predetermined number of times includes alternately performing the supply of the first raw material and the supply of the second raw material by a plurality of number of times.

In some embodiments, the step of forming the metal carbonitride film includes alternately performing the first step of alternately supplying the first raw material and the second raw material by the first predetermined number of times and the second step of supplying the nitridation raw material, by a plurality of number of times.

In some embodiments, the first step of alternately supplying the first raw material and the second raw material by the first predetermined number of times includes forming a metal carbide layer containing the first metal element on the substrate, and the second step of supplying the nitridation raw material includes forming a metal carbonitride layer containing the first metal element by nitriding the metal carbide layer.

In some embodiments, the first step of alternately supplying the first raw material and the second raw material by the first predetermined number of times includes forming a metal carbide layer containing the first metal element on the substrate while discharging the halogen element contained in the first raw material and the second metal element contained in the second raw material, as the form of gas, and the second step of supplying the nitridation raw material includes forming a metal carbonitride layer containing the first metal element by nitrizing the metal carbide layer.

Another aspect of the present disclosure may provide a method of manufacturing a semiconductor device, including: alternately performing (i) a first step of alternately supplying a first raw material containing a first metal element and a halogen element and a second raw material containing a second metal element and carbon to a substrate by a first predetermined number of times to form a metal carbide layer containing the first metal element on the substrate while discharging the halogen element contained in the first raw material and the second metal element contained in the second raw material, as a form of gas, and (ii) a second step of supplying a nitridation raw material to the substrate to nitride the metal carbide layer, by a second predetermined number of times, wherein alternating the first and second steps forms a metal carbonitride layer containing the first metal element having a predetermined thickness on the substrate.

In some embodiments, the first step of alternately supplying the first raw material and the second raw material by the first predetermined number of times includes transforming and discharging the halogen element contained in the first raw material and the second metal element contained in the second raw material, as a gaseous material.

In some embodiments, the first step of alternately supplying the first raw material and the second raw material by the first predetermined number of times includes transforming and discharging the halogen element contained in the first raw material and the second metal element contained in the second raw material, as a gaseous material containing the halogen element, a gaseous material containing the second metal element, and/or a gaseous material containing the halogen element and the second metal element.

In some embodiments, the first step of alternately supplying the first raw material and the second raw material by the first predetermined number of times includes generating and discharging the halogen element contained in the first raw material and the second metal element contained in the second raw material, as a gaseous material containing the halogen element, a gaseous material containing the second metal element, and/or a gaseous material containing the halogen element and the second metal element.

Another aspect of the present disclosure provides a method of processing a substrate, including: alternately performing a first step of supplying a first raw material containing a first metal element and a halogen element and a second raw material containing a second metal element and carbon to a substrate by the first predetermined number of times and a second step of supplying a nitridation raw material to the substrate, by the second predetermined number of times, wherein alternating the first and second steps forms a metal carbonitride film containing the first metal element having a predetermined thickness on a substrate.

Another aspect of the present disclosure provides a substrate processing apparatus including: a process chamber configured to accommodate a substrate; a first raw material supply system configured to supply a first raw material containing a first metal element and a halogen element to the substrate in the process chamber; a second raw material supply system configured to supply a second raw material containing a second metal element and carbon to the substrate in the process chamber; a niridation raw material supply system configured to supply a nitridation raw material to the substrate in the process chamber; and a control unit configured to control the first raw material supply system, the second raw material supply system and the nitridation raw material supply system so as to alternately perform (i) a first step of alternately supplying the first raw material and the second raw material to the substrate in the process chamber by the first predetermined number of times, and (ii) a second step of supplying the nitridation raw material to the substrate in the process chamber, by the second predetermined number of times, wherein alternating the first and second steps forms a metal carbonitride film containing the first metal element having a predetermined thickness on the substrate.

Another aspect of the present disclosure provides a program that causes a computer to perform a process including: alternately performing (i) a first step of alternately supplying a first raw material containing a first metal element and a halogen element and a second raw material containing a second metal element and carbon to a substrate in a process chamber of a substrate processing apparatus by the first predetermined number of times, and (ii) a second step of supplying a nitridation raw material to the substrate in the process chamber, by the second predetermined number of times, wherein alternating the first and second steps forms a metal carbonitride film containing the first metal element having a predetermined thickness on the substrate.

Another aspect of the present disclosure provides a non-transitory computer-readable recording medium storing a program that causes a computer to perform a process including: alternately performing (i) a first step of alternately supplying a first raw material containing a first metal element and a halogen element and a second raw material containing a second metal element and carbon to a substrate in a process chamber of a substrate processing apparatus by the first predetermined number of times, and (ii) a second step of supplying a nitridation raw material to the substrate in the process chamber, by the second predetermined number of times, wherein alternating the first and second steps forms a metal carbonitride film containing the first metal element having a predetermined thickness on the substrate.

Another aspect of the present disclosure provides a method of manufacturing a semiconductor device, including: alternately performing a first step of supplying a first raw material containing a first metal element and a halogen element to a substrate and a second step of supplying a second raw material containing a second metal element and carbon to the substrate, by the predetermined number of times, wherein alternating the first and second steps forms a metal carbide film containing the first metal element having a predetermined thickness on the substrate.

Another aspect of the present disclosure provides a method of manufacturing a semiconductor device, including: alternately performing a first step of supplying a first raw material containing a first metal element and a halogen element to a substrate and a second step of supplying a second raw material containing a second metal element and carbon to the substrate, by the predetermined number of times, wherein alternating the first and second steps forms a metal carbide film containing the first metal element having a predetermined thickness on the substrate while discharging the halogen element contained in the first raw material and the second metal element contained in the second raw material, as the form of gas.

Another aspect of the present disclosure provides a method of processing a substrate, including: alternately performing a first step of supplying a first raw material containing a first metal element and a halogen element to a substrate and a second step of supplying a second raw material containing a second metal element and carbon to the substrate, by the predetermined number of times, wherein alternating the first and second steps forms a metal carbide film containing the first metal element having a predetermined thickness on the substrate.

Another aspect of the present disclosure provides a substrate processing apparatus including: a process chamber configured to accommodate a substrate; a first raw material supply system configured to supply a first raw material containing a first metal element and a halogen element to the substrate in the process chamber; a second raw material supply system configured to supply a second raw material containing a second metal element and carbon to the substrate in the process chamber; and a control unit configured to control the first raw material supply system and the second raw material supply system to alternately perform a step of supplying the first raw material to the substrate in the process chamber and a step of supplying the second raw material to the substrate in the process chamber, by the predetermined number of times, thereby forming a metal carbide film containing the first metal element having a predetermined thickness on the substrate.

Another aspect of the present disclosure provides a program that causes a computer to perform a process including: alternately performing a first step of supplying a first raw material containing a first metal element and a halogen element to a substrate in a process chamber of a substrate processing apparatus and a second step of supplying a second raw material containing a second metal element and carbon to the substrate in the process chamber, by the predetermined number of times, wherein alternating the first and second steps forms a metal carbide film containing the first metal element having a predetermined thickness on the substrate.

Another aspect of the present disclosure provides a non-transitory computer-readable recording medium storing a program to cause a computer to perform a process including: alternately performing a first step of supplying a first raw material containing a first metal element and a halogen element to a substrate in a process chamber of a substrate processing apparatus and a second step of supplying a second raw material containing a second metal element and carbon to the substrate in the process chamber, by the predetermined number of times, wherein alternating the first and second steps forms a metal carbide film containing the first metal element having a predetermined thickness on the substrate.

According to the present disclosure in some embodiments, it is possible to provide a semiconductor device manufacturing method, a substrate processing method, a substrate processing apparatus and a program which are capable of forming a metal carbide film with good step coverage.

While certain embodiments have been described, these embodiments have been presented by way of example only, and are not intended to limit the scope of the disclosure. Indeed, the novel methods and apparatuses described herein may be embodied in a variety of other forms; furthermore, various omissions, combinations, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of manufacturing a semiconductor device, comprising forming a film containing a first metal element and carbon on a substrate by performing, one or more times, a cycle including:
   (a) supplying a first raw material containing a halogen element and the first metal element including at least one selected from a group consisting of titanium, tantalum, hafnium, zirconium, molybdenum and tungsten to the substrate to form a first layer containing the first metal element and the halogen element; and
   (b) supplying a second raw material containing carbon and a second metal element including at least one selected from a group consisting of titanium, tantalum, hafnium, zirconium, molybdenum, tungsten and aluminum to the first layer to transform the halogen element contained in the first layer into a gaseous material by reaction of the halogen element with the second metal element contained in the second raw material and bond the first element contained in the first layer with the carbon contained in the second raw material, thereby forming a metal carbide layer containing the first metal element and the carbon,
   wherein in the act of supplying the second raw material, the gaseous material is discharged.

2. The method of claim 1, wherein the first layer includes a discontinuous layer containing the first metal element and the halogen element.

3. The method of claim 1, wherein the first layer includes a continuous layer containing the first metal element and the halogen element.

4. The method of claim 1, wherein the first layer includes a layer composed of a combination of at least one of a discontinuous layer containing the first metal element and the halogen element or a continuous layer containing the first metal element and the halogen element.

5. The method of claim 1, wherein the first layer includes a discontinuous chemical adsorption layer of the first raw material.

6. The method of claim 1, wherein the first layer includes a continuous chemical adsorption layer of the first raw material.

7. The method of claim 1, wherein the halogen element includes chlorine or fluorine.

8. The method of claim 1, wherein the second raw material includes a methyl group.

9. The method of claim 1, wherein the second raw material includes a cyclopentadienyl group.

10. The method of claim 1, wherein the second raw material includes an ethyl group.

11. The method of claim 1, wherein the first raw material includes at least one selected from a group consisting of $TiCl_4$, $TiF_4$, $TaCl_5$, $TaF_5$, $HfCl_4$, $HfF_4$, $ZrCl_4$, $ZrF_4$, $MoCl_5$, $MoF_5$, $WCl_6$ and $WF_6$, and
   wherein the second raw material includes at least one selected from a group consisting of $Hf[C_5H_4(CH_3)]_2(CH_3)_2$, $Zr[C_5H_4(CH_3)]_2(CH_3)_2$, $Hf[N(C_2H_5)(CH_3)]_4$, $Zr[N(C_2H_5)(CH_3)]_4$, $Hf[N(CH_3)_2]_4$, $Ti[N(CH_3)_2]_4$ and $Al(CH_3)_3$.

12. The method of claim 1, wherein the first metal element contained in the first layer and the carbon contained in the second raw material are bonded, in the (b).

13. The method of claim 1, wherein the halogen element contained in the first layer and the second metal element contained in the second raw material are transformed into at least one selected from a group consisting of a gaseous material containing the halogen element, a gaseous material containing the second metal element and a gaseous material containing the halogen element and the second metal element, and discharged, in the (b).

14. The method of claim 1, wherein the halogen element contained in the first layer and the second metal element contained in the second raw material are reacted to produce at least one selected from a group consisting of a gaseous material containing the halogen element, a gaseous material containing the second metal element and a gaseous material containing the halogen element and the second metal element to be discharged as a gas, in the (b).

15. The method of claim 1, wherein the cycle further includes (c) supplying a nitridation raw material to the substrate to nitride the metal carbide layer.

16. The method of claim 15, wherein the (c) is performed under condition where a nitridation reaction of the metal carbide layer is unsaturated.

17. The method of claim 15, wherein the cycle includes:
   alternately performing one or more times
   a first process of alternately performing the (a) and the (b) one or more times, and
   a second process of performing the (c).

18. The method of claim 15, wherein the cycle includes:
   alternately performing one or more times
   a first process of alternately performing the (a) and the (b) more than once, and
   a second process of performing the (c).

19. The method of claim 15, wherein the film containing the first metal element and the carbon further contains nitrogen.

20. A substrate processing apparatus comprising:
   a process chamber configured to accommodate a substrate;
   a first raw material supply system configured to supply a first raw material containing a halogen element and a first metal element including at least one selected from a group consisting of titanium, tantalum, hafnium, zirconium, molybdenum and tungsten to the substrate in the process chamber;
   a second raw material supply system configured to supply a second raw material containing carbon and a second metal element including at least one selected from a group consisting of titanium, tantalum, hafnium, zirconium, molybdenum, tungsten and aluminum to the substrate in the process chamber; and a control unit configured to control the first raw material supply system and the second raw material supply system so as to form a film containing the first metal element and the carbon on the substrate by performing one or more times a cycle including:
(a) supplying the first raw material to the substrate in the process chamber to form a first layer containing the first metal element and the halogen element; and
(b) supplying the second raw material to the first layer in the process chamber to transform the halogen element contained in the first layer into a gaseous material by reaction of the halogen element with the second metal element contained in the second raw material and bond the first element contained in the first layer with the carbon contained in the second raw material, thereby forming a metal carbide layer containing the first metal element and the carbon,
wherein in the act of supplying the second raw material, the gaseous material is discharged.

21. A non-transitory computer-readable recording medium storing a program that causes a computer to perform a process comprising forming a film containing a first metal element and carbon on a substrate by performing one or more times a cycle including:
(a) supplying a first raw material containing a halogen element and the first metal element including at least one selected from a group consisting of titanium, tantalum, hafnium, zirconium, molybdenum and tungsten to the substrate to form a first layer containing the first metal element and the halogen element; and
(b) supplying a second raw material containing carbon and a second metal element including at least one selected from a group consisting of titanium, tantalum, hafnium, zirconium, molybdenum, tungsten and aluminum to the first layer to transform the halogen element contained in the first layer into a gaseous material by reaction of the halogen element with the second metal element contained in the second raw material and bond the first element contained in the first layer with the carbon contained in the second raw material, thereby forming a metal carbide layer containing the first metal element and the carbon,
wherein in the act of supplying the second raw material, the gaseous material is discharged.

* * * * *